(12) United States Patent
Kim et al.

(10) Patent No.: US 12,376,319 B2
(45) Date of Patent: Jul. 29, 2025

(54) SUPPORT SHIELD STRUCTURES FOR TRENCHED SEMICONDUCTOR DEVICES

(71) Applicant: Wolfspeed, Inc., Durham, NC (US)

(72) Inventors: Woongsun Kim, Cary, NC (US); Daniel Jenner Lichtenwalner, Raleigh, NC (US); Naeem Islam, Morrisville, NC (US); Madankumar Sampath, Morrisville, NC (US); Sei-Hyung Ryu, Cary, NC (US)

(73) Assignee: WOLFSPEED, INC., Durham, NC (US)

( * ) Notice: Subject to any disclaimer, the term of this patent is extended or adjusted under 35 U.S.C. 154(b) by 605 days.

(21) Appl. No.: 17/703,708

(22) Filed: Mar. 24, 2022

(65) Prior Publication Data

US 2023/0307529 A1 Sep. 28, 2023

(51) Int. Cl.
*H01L 21/78* (2006.01)
*H10D 12/00* (2025.01)
(Continued)

(52) U.S. Cl.
CPC ......... *H10D 12/481* (2025.01); *H10D 12/032* (2025.01); *H10D 62/127* (2025.01); *H10D 64/513* (2025.01)

(58) Field of Classification Search
CPC ............. H01L 29/7397; H01L 29/0696; H01L 29/4236; H01L 29/66333; H01L 29/1608;
(Continued)

(56) References Cited

U.S. PATENT DOCUMENTS 8,076,719 B2 * 12/2011 Zeng ................... H01L 29/7813
257/334
8,354,711 B2 * 1/2013 Zeng ................... H01L 29/0878
257/341

(Continued)

FOREIGN PATENT DOCUMENTS

WO 2020015961 A1 1/2020

OTHER PUBLICATIONS

Notification of Transmittal of the International Search Report and the Written Opinion of the International Searching Authority, or the Declaration, in corresponding PCT Application No. PCT/US2023/015609 (Jun. 27, 2023).

*Primary Examiner* — Vu A Vu
(74) *Attorney, Agent, or Firm* — Myers Bigel, P.A.

(57) ABSTRACT

A power semiconductor device includes a semiconductor layer structure comprising a drift region of a first conductivity type, and a gate trench extending into the drift region. The gate trench includes sidewalls and a bottom surface therebetween. A bottom shielding structure of a second conductivity type is provided under the bottom surface of the gate trench. First and second support shielding structures of the second conductivity type extend into the drift region on opposing sides of the gate trench and are spaced apart from the sidewalls thereof. A material composition, distance of extension into the drift region relative to a surface of the semiconductor layer structure, and/or dopant concentration of the bottom shielding structure may be different from that of the first and second support shielding structures. Related devices and fabrication methods are also discussed.

34 Claims, 13 Drawing Sheets

(51) Int. Cl.
*H10D 12/01* (2025.01)
*H10D 62/10* (2025.01)
*H10D 64/27* (2025.01)

(58) Field of Classification Search
CPC ............. H01L 29/0623; H01L 29/0878; H01L 29/267; H01L 29/66068; H01L 29/66734; H01L 29/7813; H01L 29/0626
USPC ...................................................... 257/228
See application file for complete search history.

(56) References Cited

U.S. PATENT DOCUMENTS

| | | | |
|---|---|---|---|
| 8,390,060 B2 * | 3/2013 | Darwish | H01L 29/7397 257/341 |
| 8,680,607 B2 * | 3/2014 | Zeng | H01L 29/66719 257/E29.183 |
| 9,012,984 B2 | 4/2015 | Cheng et al. | |
| 9,024,379 B2 * | 5/2015 | Darwish | H01L 21/823475 257/334 |
| 9,087,911 B2 * | 7/2015 | Alexandrov | H01L 29/8083 |
| 9,142,668 B2 | 9/2015 | Cheng et al. | |
| 9,240,476 B2 | 1/2016 | Pala et al. | |
| 9,306,061 B2 | 4/2016 | Cheng et al. | |
| 9,887,287 B1 * | 2/2018 | Lichtenwalner | H01L 29/66068 |
| 10,720,511 B2 * | 7/2020 | Darwish | H01L 29/41766 |
| 11,316,021 B2 * | 4/2022 | Darwish | H01L 29/404 |
| 2017/0213908 A1 * | 7/2017 | Fursin | H01L 29/407 |
| 2018/0166530 A1 | 6/2018 | Lichtenwalner et al. | |
| 2018/0366569 A1 * | 12/2018 | Zeng | H01L 29/7813 |
| 2019/0288104 A1 | 9/2019 | Kinoshita | |
| 2021/0083061 A1 * | 3/2021 | Darwish | H01L 29/4236 |
| 2022/0130998 A1 * | 4/2022 | Kim | H01L 29/7813 |

* cited by examiner

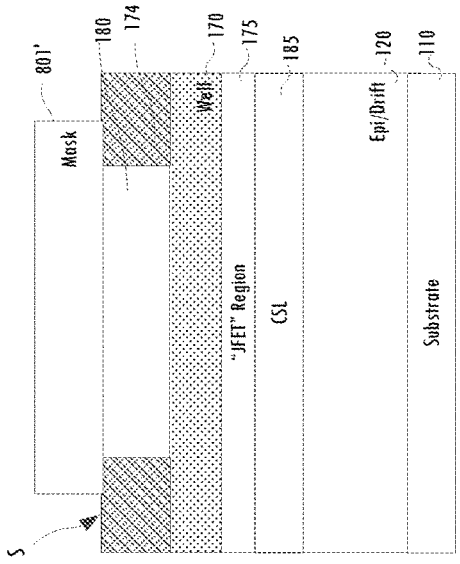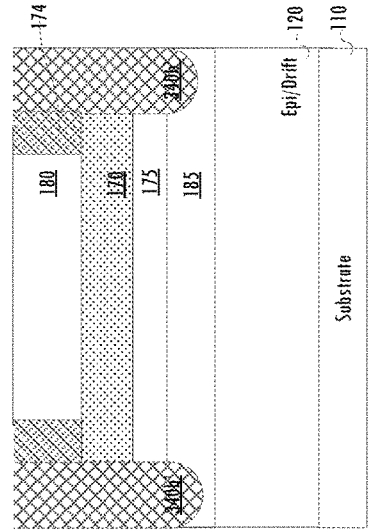
*FIG. 8B*
*FIG. 8D*
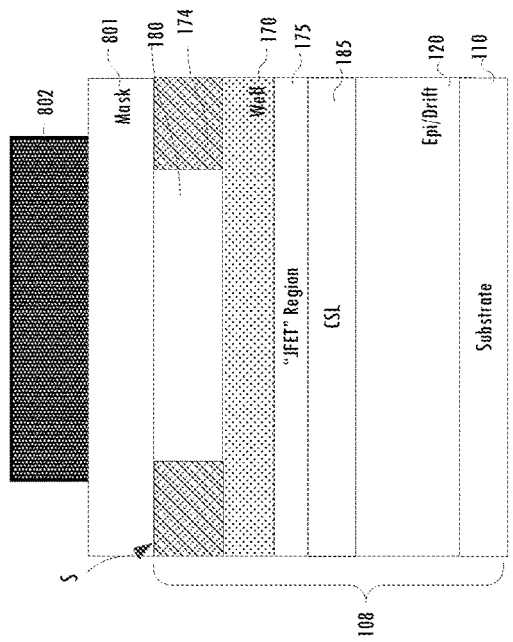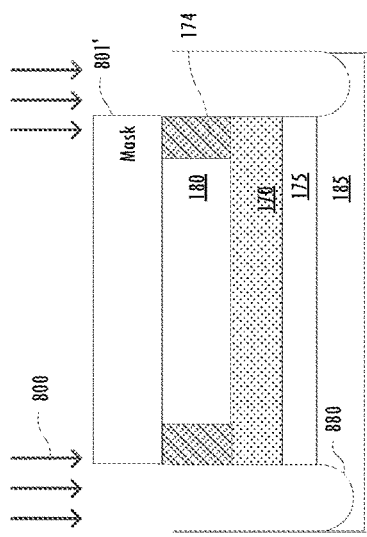
*FIG. 8A*
*FIG. 8C*

SUPPORT SHIELD STRUCTURES FOR TRENCHED SEMICONDUCTOR DEVICES

FIELD

The present invention relates to semiconductor devices and, more particularly, to power semiconductor devices.

BACKGROUND

Power semiconductor devices refer to devices that include one or more "power" semiconductor die that are designed to carry large currents (e.g., tens or hundreds of Amps) and/or that are capable of blocking high voltages (e.g., hundreds, thousand or tens of thousands of volts). A wide variety of power semiconductor devices are known in the art including, for example, power Metal Insulator Semiconductor Field Effect Transistors ("MISFETs", including Metal Oxide Semiconductor FETs ("MOSFETs")), bipolar junction transistors ("BJTs"), Insulated Gate Bipolar Transistors ("IGBT"), Junction Barrier Schottky diodes, Gate Turn-Off Transistors ("GTO"), MOS-controlled thyristors, and various other devices. These power semiconductor devices are generally fabricated from wide bandgap semiconductor materials, for example, silicon carbide ("SiC") or Group III nitride (e.g., gallium nitride ("GaN"))-based semiconductor materials. Herein, a wide bandgap semiconductor material refers to a semiconductor material having a bandgap greater than about 1.40 eV, for example, greater than about 2 eV.

A conventional power semiconductor device typically has a semiconductor substrate having a first conductivity type (e.g., an n-type substrate) on which an epitaxial layer structure having the first conductivity type (e.g., n-type) is formed. A portion of this epitaxial layer structure (which may comprise one or more separate layers) functions as a drift layer or drift region of the power semiconductor device. The device typically includes an "active region," which includes one or more "unit cell" structures that have a junction, for example, a p-n junction. The active region may be formed on and/or in the drift region. The active region acts as a main junction for blocking voltage in the reverse bias direction and providing current flow in the forward bias direction. The power semiconductor device may also have an edge termination in a termination region that is adjacent the active region. One or more power semiconductor devices may be formed on the substrate, and each power semiconductor device will typically have its own edge termination. After the substrate is fully processed, the resultant structure may be diced to separate the individual edge-terminated power semiconductor devices.

Power semiconductor devices may have a unit cell configuration in which a large number of individual unit cell structures of the active region are electrically connected (e.g., in parallel) to function as a single power semiconductor device. In high power applications, such a power semiconductor device may include thousands or tens of thousands of unit cells implemented in a single chip or "die." A die or chip may include a small block of semiconducting material or other substrate in which electronic circuit elements are fabricated. For example, a plurality of individual power semiconductor devices may be formed on a relatively large semiconductor substrate (e.g., by growing epitaxial layers there on doping selected regions with dopants, forming insulation and metal layers thereon, etc.) and the completed structure may then be cut (e.g., by a sawing or dicing operation) into a plurality of individual die, each of which is a power semiconductor device.

Power semiconductor devices can have a lateral structure or a vertical structure. In a device having a lateral structure, the terminals of the device (e.g., the drain, gate and source terminals for a power MOSFET device) are on the same major surface (e.g., top or bottom) of a semiconductor layer structure. In contrast, in a device having a vertical structure, at least one terminal is provided on each major surface of the semiconductor layer structure (e.g., in a vertical MOSFET device, the source may be on the top surface of the semiconductor layer structure and the drain may be on the bottom surface of the semiconductor layer structure). The semiconductor layer structure may or may not include an underlying substrate. Herein, the term "semiconductor layer structure" refers to a structure that includes one or more semiconductor layers, including semiconductor substrates and/or semiconductor epitaxial layers.

Vertical power semiconductor devices, such as MOSFET or IGBT devices, can have a standard gate electrode design in which the gate electrode of the transistor is formed on top of the semiconductor layer structure or, alternatively, may have the gate electrode buried in a trench within the semiconductor layer structure. Devices having buried gate electrodes are typically referred to as gate trench devices. With the standard gate electrode design, the channel region of each unit cell transistor is horizontally disposed underneath the gate electrode. In contrast, in the gate trench design, the channel is vertically disposed. Gate trench devices may provide enhanced performance, but typically require more complex manufacturing processes.

Power semiconductor devices are designed to block (in the forward or reverse blocking state) or pass (in the forward operating state) large voltages and/or currents. For example, in the blocking state, a power semiconductor device may be designed to sustain hundreds or thousands of volts of electric potential. As the applied voltage approaches or passes the voltage level that the device is designed to block, non-trivial levels of current (referred to as leakage current) may begin to flow through the power semiconductor device. The blocking capability of the device may be a function of, among other things, the doping density/concentration and thickness of the drift region. Leakage currents may also arise for other reasons, such as failure of the edge termination and/or the primary junction of the device. If the voltage applied to the device is increased beyond the breakdown voltage to a critical level, the increasing electric field may result in an uncontrollable and undesirable runaway generation of charge carriers within the semiconductor device, leading to a condition known as avalanche breakdown.

Also, the relatively thin gate insulating layer (e.g., a gate oxide layer) that separates the gate electrode from the semiconductor layer structure can degrade when the gate insulating layer is subjected to high electric field levels, during either on-state (conducting) or off-state (blocking) operation. This degradation of the gate insulating layer may ultimately lead to breakdown of the gate insulating layer, at which point the gate electrode may short circuit to the semiconductor layer structure, which can destroy the device.

SUMMARY

According to some embodiments, a power semiconductor device includes a semiconductor layer structure comprising a drift region of a first conductivity type; a gate trench extending into the drift region, the gate trench comprising sidewalls and a bottom surface therebetween; a bottom shielding structure of a second conductivity type under the bottom surface of the gate trench; and first and second support shielding structures of the second conductivity type extending into the drift region on opposing sides of the gate trench and spaced apart from the sidewalls thereof.

In some embodiments, one or more of the first and second support shielding structures extends into the drift region to a different depth than that of the bottom shielding structure relative to a surface of the semiconductor layer structure.

In some embodiments, the first and second support shielding structures extend into the drift region beyond the bottom shielding structure by about 0.1 to about 1 micron.

In some embodiments, at least one of the bottom shielding structure, the first support shielding structure, or the second support shielding structure comprises a material that is different from that of the drift region.

In some embodiments, the drift region comprises a wide bandgap semiconductor material, and the at least one of the bottom shielding structure, the first support shielding structure, or the second support shielding structure comprises polysilicon, nickel oxide, gallium nitride, or gallium oxide.

In some embodiments, the at least one of the bottom shielding structure, the first support shielding structure, or the second support shielding structure further comprises an implanted portion of the drift region.

In some embodiments, the bottom shielding structure comprises a first concentration of dopants of the second conductivity type, and the first and second support shielding structures comprise a second concentration of dopants of the second conductivity type that is different from the first concentration.

In some embodiments, the second concentration is higher than the first concentration.

In some embodiments, the semiconductor layer structure further comprises a substrate including the drift region thereon and a well region of the second conductivity type in or on the drift region opposite the substrate. The first and second support shielding structures extend through the well region and beyond the bottom shielding structure, and are spaced apart from the substrate.

In some embodiments, the first and second support shielding structures have a different concentration of dopants of the second conductivity type than the well region.

In some embodiments, the first and second support shielding structures are spaced apart from the substrate by about 1 to about 100 microns.

In some embodiments, the bottom shielding structure extends along a portion of the bottom surface of the gate trench.

In some embodiments, the bottom shielding structure extends along an entirety of the bottom surface of the gate trench.

According to some embodiments, a power semiconductor device includes a semiconductor layer structure comprising a drift region of a first conductivity type; a gate trench extending into the drift region, the gate trench comprising sidewalls and a bottom surface therebetween; a bottom shielding structure of a second conductivity type under the bottom surface of the gate trench; and first and second support shielding structures of the second conductivity type extending into the drift region on opposing sides of and spaced apart from the sidewalls of the gate trench. A material composition, distance of extension into the drift region relative to a surface of the semiconductor layer structure, and/or dopant concentration of the bottom shielding structure is different from that of the first and second support shielding structures.

In some embodiments, the distance of extension into the drift region of one or more of the first and second support shielding structures is greater than that of the bottom shielding structure relative to the surface of the semiconductor layer structure.

In some embodiments, the first and second support shielding structures extend into the drift region beyond the bottom shielding structure by about 0.1 to about 1 micron.

In some embodiments, the material composition of at least one of the bottom shielding structure, the first support shielding structure, or the second support shielding structure is different from that of the drift region.

In some embodiments, the drift region comprises a wide bandgap semiconductor material, and the at least one of the bottom shielding structure, the first support shielding structure, or the second support shielding structure comprises polysilicon, nickel oxide, gallium nitride, or gallium oxide.

In some embodiments, the at least one of the bottom shielding structure, the first support shielding structure, or the second support shielding structure further comprises an implanted region of the drift region.

In some embodiments, the dopant concentration of the first and second support shielding structures is lower than that of the bottom shielding structure.

In some embodiments, the dopant concentration of the first and second support shielding structures is higher than that of the bottom shielding structure.

In some embodiments, the semiconductor layer structure further comprises a substrate including the drift region thereon, and wherein the first and second support shielding structures are spaced apart from the substrate by about 1 to about 100 microns.

According to some embodiments, a method of fabricating a power semiconductor device includes providing a semiconductor layer structure comprising a drift region of a first conductivity type; forming a bottom shielding structure and first and second support shielding structures of a second conductivity type extending into the drift region; and forming a gate trench extending into the drift region and spaced apart from the first and second support shielding structures, where the bottom shielding structure is under the gate trench.

In some embodiments, forming the gate trench is performed after forming the bottom shielding structure.

In some embodiments, forming the bottom shielding structure and the first and second support shielding structures includes forming one or more of the first and second support shielding structures extending into the drift region to a different depth than that of the bottom shielding structure relative to a surface of the semiconductor layer structure.

In some embodiments, the first and second support shielding structures extend into the drift region beyond the bottom shielding structure by about 0.1 to about 1 micron.

In some embodiments, forming at least one of the bottom shielding structure or the first and second support shielding structures includes performing one or more etching operations to form respective shielding trenches in the drift region; and performing one or more deposition operations to form a material that is different from that of the drift region in the respective shielding trenches.

In some embodiments, the drift region comprises a wide bandgap semiconductor material, and the at least one of the bottom shielding structure or the first and second support shielding structure comprises polysilicon, nickel oxide, gallium nitride, or gallium oxide.

In some embodiments, forming the at least one of the bottom shielding structure or the first and second support shielding structures further includes performing one or more ion implantation operations to implant dopants of the second conductivity type into portions of the drift region under the respective shielding trenches.

In some embodiments, forming at least one of the bottom shielding structure or the first and second support shielding structures includes performing one or more ion implantation operations to implant dopants of the second conductivity type into the drift region.

In some embodiments, responsive to the one or more ion implantation operations, the bottom shielding structure comprises a first concentration of the dopants of the second conductivity type, and the first and second support shielding structures comprise a second concentration of dopants of the second conductivity type that is different from the first concentration. The second concentration may be higher than the first concentration.

According to some embodiments, a method of fabricating a power semiconductor device includes providing a semiconductor layer structure comprising a drift region of a first conductivity type; forming first and second support shielding structures of a second conductivity type extending into the drift region; forming a gate trench extending into the drift region and spaced apart from the first and second support shielding structures, the gate trench comprising sidewalls and a bottom surface therebetween; and forming a bottom shielding structure of the second conductivity type under the bottom surface of the gate trench.

In some embodiments, forming the bottom shielding structure includes, after forming the gate trench, performing one or more ion implantation and/or deposition operations to form the bottom shielding structure extending into the drift region to a first depth relative to a surface of the semiconductor layer structure.

In some embodiments, a material composition, distance of extension into the drift region relative to the surface of the semiconductor layer structure, and/or dopant concentration of the bottom shielding structure is different from that of the first and second support shielding structures.

In some embodiments, forming the first and second support shielding structures includes, before forming the gate trench, forming one or more of the first and second support shielding structures extending into the drift region to a second depth relative to the surface of the semiconductor layer structure, where the second depth is different than the first depth.

In some embodiments, the second depth is greater than the first depth by about 0.1 to about 1 micron.

In some embodiments, forming the first and second support shielding structures includes, before forming the gate trench, performing one or more etching operations to form respective shielding trenches in the drift region, and performing one or more deposition operations to form a material that is different from that of the drift region in the respective shielding trenches.

In some embodiments, the drift region comprises a wide bandgap semiconductor material, and at least one of the bottom shielding structure or the first and second support shielding structures comprises polysilicon, nickel oxide, gallium nitride, or gallium oxide.

In some embodiments, forming the first and second support shielding structures further includes, before forming the gate trench, performing one or more ion implantation operations to implant dopants of the second conductivity type into portions of the drift region under the respective shielding trenches.

In some embodiments, forming the first and second support shielding structures includes, before forming the gate trench, performing one or more ion implantation operations to implant dopants of the second conductivity type into the drift region.

In some embodiments, responsive to the one or more ion implantation operations, the first and second support shielding structures comprise a second concentration of dopants of the second conductivity type that is different from a first concentration of the dopants of the second conductivity type of the bottom shielding structure. The second concentration is higher than the first concentration.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIGS. 8A, 8B, 8C, 8D, 8E, 8F, 8G, and 8H are schematic cross-sectional views illustrating example fabrication operations for forming power semiconductor devices including bottom shielding structures below the gate trenches and support shielding structures spaced apart from sidewalls of the gate trenches according to yet further embodiments of the present invention.

DETAILED DESCRIPTION OF EMBODIMENTS

Figure 1A:
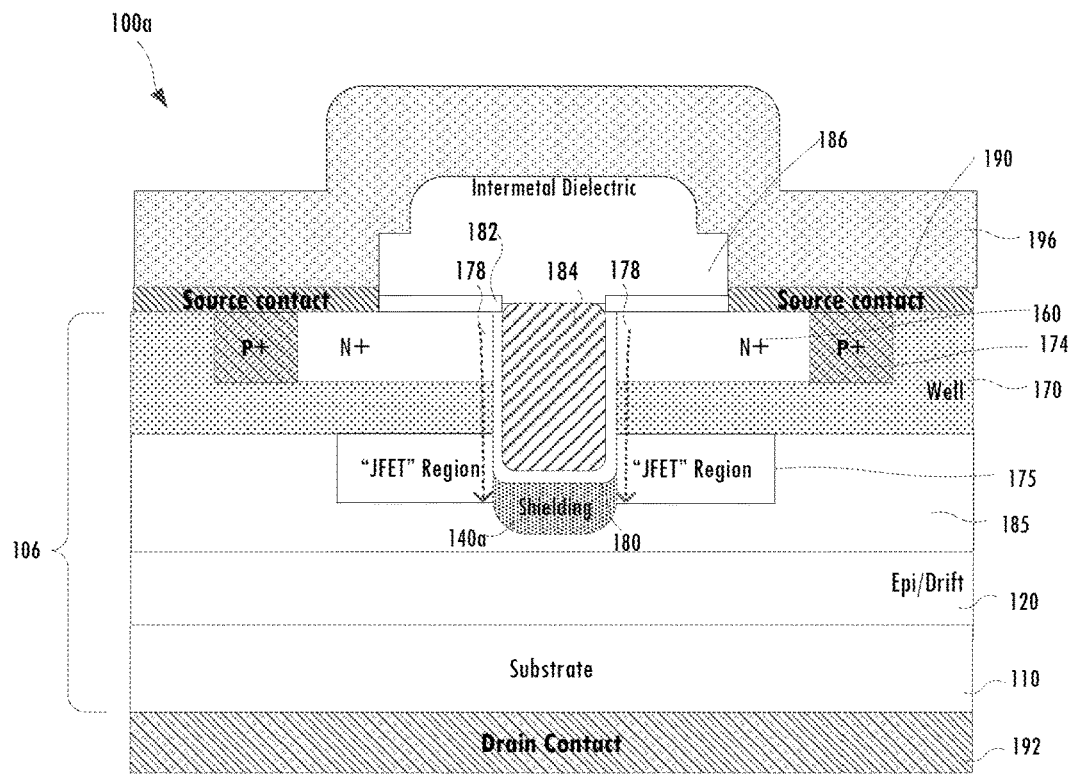
FIG. 1A is a schematic cross-sectional view illustrating an example unit cell of a gate trench power semiconductor device including shielding regions positioned below the gate trenches.

Some embodiments of the present invention are directed to improvements in power semiconductor devices (e.g., MOSFETs, IGBTs, and other gate controlled power devices). Many power semiconductor devices include so-called deep or 'buried' shielding semiconductor regions, also referred to as shielding structures, of a different conductivity type than the layer(s) of the semiconductor material underneath the well regions and/or gate electrodes of the device. For example, in devices having gate electrodes and gate insulating layers formed within trenches in the semiconductor layer structure, high electric fields may degrade the gate insulating layer over time, and may eventually result in failure of the device. The deep shielding structures may thus be provided underneath the gate trenches in order to reduce the electric field levels in the gate insulating layer, particularly at corners of the gate trenches where the electric field levels may be more concentrated. The shielding structures may have the same conductivity type as the well regions, which is opposite the conductivity type of the drift region.

The deep shielding structures may typically include highly doped semiconductor regions having the same conductivity type as the channel region. Methods for doping a semiconductor material with n-type and/or p-type dopants include (1) doping the semiconductor material during the growth thereof, (2) diffusing the dopants into the semiconductor material and (3) using ion implantation to selectively implant the dopants in the semiconductor material. When silicon carbide is doped during epitaxial growth, the dopants tend to unevenly accumulate, and hence the dopant concentration may vary by, for example, +/−15%, which can negatively affect device operation and/or reliability. Additionally, doping by diffusion may not be an option in silicon carbide, gallium nitride and various wide band-gap semiconductor devices since n-type and p-type dopants tend to not diffuse well (or at all) in those materials, even at high temperatures.

In light of the above, ion implantation is often used to dope wide band-gap semiconductor materials, such as silicon carbide. However, in gate-trench vertical power devices (also referred to herein as trenched vertical power devices or trenched gate devices), it may be desirable to form deep shielding structures underneath the well regions and/or gate electrodes of the device, and these deep shielding structures often extend into the device to depths of about 1-3 microns or more. The depth at which the ions are implanted is directly related to the energy of the implant, i.e., ions implanted into a semiconductor layer at higher energies tend to go deeper into the layer.

Thus, forming deep shielding structures via ion implantation may require high energy implantation. However, when dopant ions are implanted into a semiconductor layer, the ions damage the crystal lattice of the semiconductor layer. This lattice damage can typically only be partly repaired by thermal annealing processes. That is, the lattice damage caused by the ion implantation process may not be completely repaired. Moreover, the amount of lattice damage may also be directly related to the implant energy, with higher energy implants tending to cause more lattice damage than lower energy implants. The uniformity of the dopant concentration also tends to decrease with increasing implant depth.

Figure 1B:
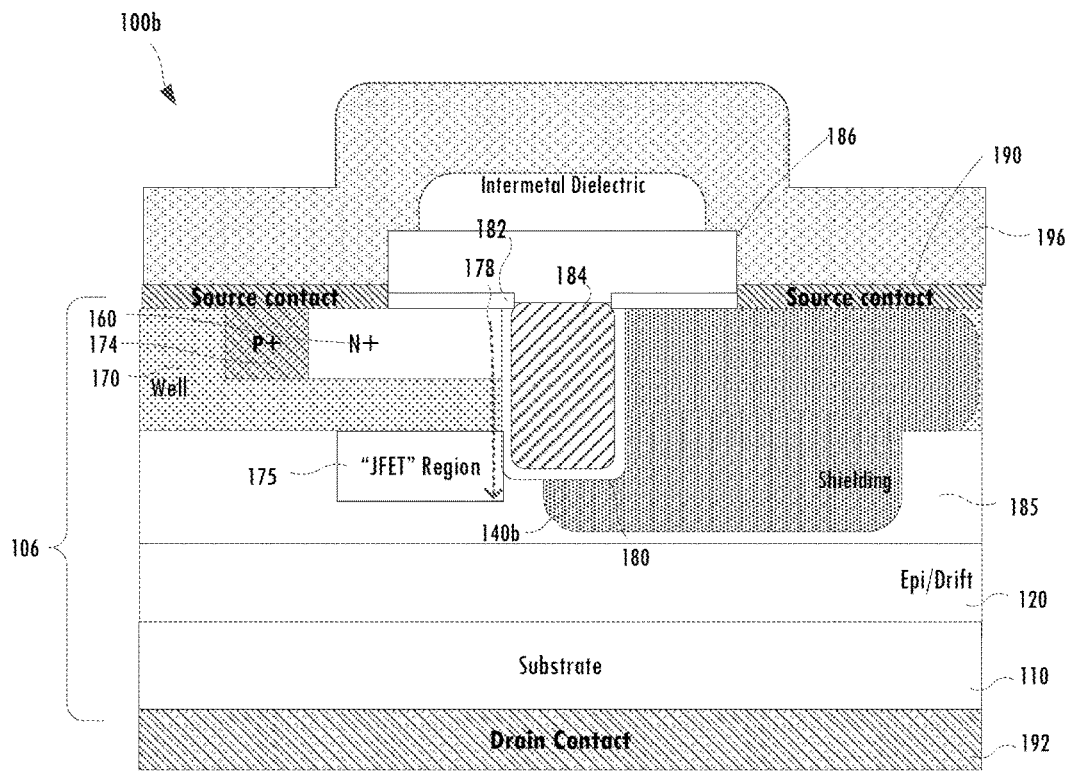
FIG. 1B is a schematic cross-sectional view illustrating an example unit cell of a gate trench power semiconductor device including shielding regions that are positioned below and along one sidewall of the gate trenches.

Various approaches may be used to form trenched vertical power semiconductor devices. FIGS. 1A and 1B schematically illustrate two examples of such different approaches.

FIGS. 1A and 1B are schematic cross-sectional views illustrating example unit cells of trenched vertical power devices (illustrated as power MOSFET 100a and 100b, respectively) including deep buried P-type shielding regions 140a, 140b. As shown in FIGS. 1A and 1B, the power MOSFET 100a, 100b each include a heavily-doped (e.g., $N^+$) first conductivity type (e.g., n-type) substrate 110. A lightly-doped (e.g., $N^-$) first conductivity type drift layer or region 120 is provided on the substrate 110, for example by epitaxial growth. The drift region 120 may be wide bandgap semiconductor material (such as silicon carbide (SiC)) in some embodiments. For example, the substrate 110 may be a 4H—SiC substrate, and the drift region 120 may be a 4H—SiC n-type epitaxial layer formed on the substrate 110. A portion of the drift region 120 may include a current spreading layer ("CSL") 185 of the first conductivity type having a higher dopant concentration than the lower portions of the drift region 120. A moderately-doped second conductivity type (e.g., p-type) layer is formed on or in (for example, by epitaxial growth or implantation) the drift region 120 and acts as the well regions (e.g., "P-wells") 170 for the device 100a, 100b. Heavily-doped second conductivity type (e.g., $P^+$) regions 174 are formed in the well regions 170, for example, via ion implantation. The transistor channels or conduction paths 178 may be formed in the moderately-doped regions P-wells 170. The substrate 110, drift region 120 (including current spreading layer 185), and the moderately doped layer defining the P-wells 170, along with the various regions/patterns formed therein, are included in a semiconductor layer structure 106 of the MOSFETs 100a, 100b.

Still referring to FIGS. 1A and 1B, trenches 180 are formed in the semiconductor layer structure 106, e.g., with 'striped' gate trench layouts in which the trenches 180 continuously extend in parallel to one another in a longitudinal direction. The trenches 180 are spaced apart in a lateral direction crossing (e.g., perpendicular to) the longitudinal direction, and extend into the drift region 120 toward the substrate 110 in a vertical direction. The trenches 180 (in which the gates electrodes 184 are formed) may be formed to extend through the moderately-doped layer 170 to define the respective P-wells. Heavily-doped (e.g., $P^+$) second conductivity type shielding structures 140a, 140b are formed in the drift region 120, for example, by ion implantation. The shielding structures 140a, 140b may be in electrical connection with the P-wells 170. A gate insulating layer 182 (e.g., a gate oxide) is conformally formed on the bottom surface and sidewalls of each trench 180. The corners of the gate trench 180 and the gate insulating layer 182 thereon may be rounded even if illustrated otherwise.

A gate electrode 184 (or "gate") is formed on each gate insulating layer 182 to fill the respective gate trenches 180. Portions of the drift region 120 that are under and/or adjacent the gate electrode 184 may be referred to as the "JFET region" 175. Vertical transistor channel regions (with conduction 178 shown by dotted arrows) are defined in the well regions 170 adjacent the gate insulating layer 182. Heavily-doped source regions 160 of the first conductivity type (e.g. N+) are formed in upper portions of the P-wells 170, for example, via ion implantation. The heavily-doped regions 174 of the second conductivity type (e.g., a P+) contact the well regions 170. Source contacts 190 are formed on the source regions 160, on the heavily-doped regions 174, and (in FIG. 1B) on the deep shielding structures 140b. The source contacts 190 may be ohmic metal in some embodiments. A drain contact 192 is formed on the lower surface of the substrate 110. A gate contact (not shown) may be electrically connected to each gate electrode 184, for example, by a conductive gate bus (not shown). An intermetal dielectric layer 186 may be formed on the gates 184, and a metal (e.g., aluminum) layer 196 may be formed on the intermetal dielectric layer 186 to contact the source contacts 190. The source contacts 190 may extend on to the intermetal dielectric 186 layer in some embodiments, and may comprise, for example, diffusion barrier and/or adhesion layers.

As noted above, some devices may be susceptible to premature oxide breakdown due to the electric field crowding effect near the corners of the gate trench 180. In the examples of FIGS. 1A and 1B, deep buried semiconductor regions or shielding patterns 140a, 140b of an opposite conductivity type than the drift region 120 are configured to prevent degradation of the trench MOSFET 100a, 100b at high electric fields. In particular, in the example devices 100a and 100b, the shielding patterns 140a, 140b at the bottom (in FIG. 1A) or at the bottom and along one sidewall (in FIG. 1B) of the gate trenches 180 are configured to provide electric field (e.g., voltage and/or current) blocking by connections to respective source contacts 190, which are connected to ground. Shielding connection patterns may be connected to the source contacts 190 at the top of the device 100a, 100b (or may be otherwise connected to the deep shielding patterns 140a, 140b) to allow the deep shielding patterns 140a, 140b to be electrically grounded.

The shielding patterns 140a, 140b may extend to one lower corner region (in FIG. 1B) or both lower corner regions (in FIG. 1A) at the bottom surfaces of the gate trenches 180. As the gate insulating layer 182 may be particularly susceptible to breakdown at the corner regions, the shielding patterns 140a, 140b may help protect the gate insulating layer 182 at the lower corner region(s) of the gate trenches 180 from high electric fields during reverse blocking operation.

FIG. 1A illustrates a bottom-gated shielding (BPS_TMOS) configuration of the shielding pattern 140a that may allow for aggressive cell pitch reduction and increased sidewall conductivity utilization. In particular, in FIG. 1A, conduction 178 (shown by dotted arrows) occurs along both sides of the channel in the device 100a. The structure of the device 100a shown in FIG. 1A may be difficult to fabricate, however, due to required masking and/or other operations to block or protect the sidewalls of the trench 180 during the implantation process used to form the shielding pattern 140a.

For more reliable on- and off-state performance and/or improved ruggedness, FIG. 1B illustrates a contacting scheme having an asymmetric shielding (APS_TMOS) configuration, where the shielding pattern 140b extends along only one sidewall of the trench 180, such that the other sidewall of the trench 180 is free of the shielding pattern 140b. However, this configuration may limit the active conducting area of the device 100b by blocking conduction 178 at one side of the channel.

Embodiments of the present invention are directed to power semiconductor devices including layouts and design arrangements that further improve reliability by forming a shielding region 240a, 340a, 340a' (also referred to herein as a bottom shielding structure 240a, 340a, 340a') at the bottom of the gate trench 180, in combination with additional support shielding structures or regions 240b, 340b, 340b' on opposing sides of and spaced apart from sidewalls of the gate trench 180. The shielding structures 240a/240b, 340a/340b, 340a'/340b' are of a second or opposite conductivity type (e.g., p-type) than the first conductivity type (e.g., n-type) of the drift region 120. Although described and illustrated herein with reference to regions of specific first and second conductivity types (i.e., n-type and p-type) by way of example, it will be understood that the conductivity types of the regions in any of the illustrated examples may be reversed (i.e., p-type and n-type) in accordance with embodiments of the present invention. Likewise, while described herein primarily with reference to MOSFET implementations, it will be appreciated that the same techniques may be used in other vertical power semiconductor devices, such as insulated gate bipolar transistors (IGBTs), and/or other related power devices utilizing a trenched structure.

Figure 2:
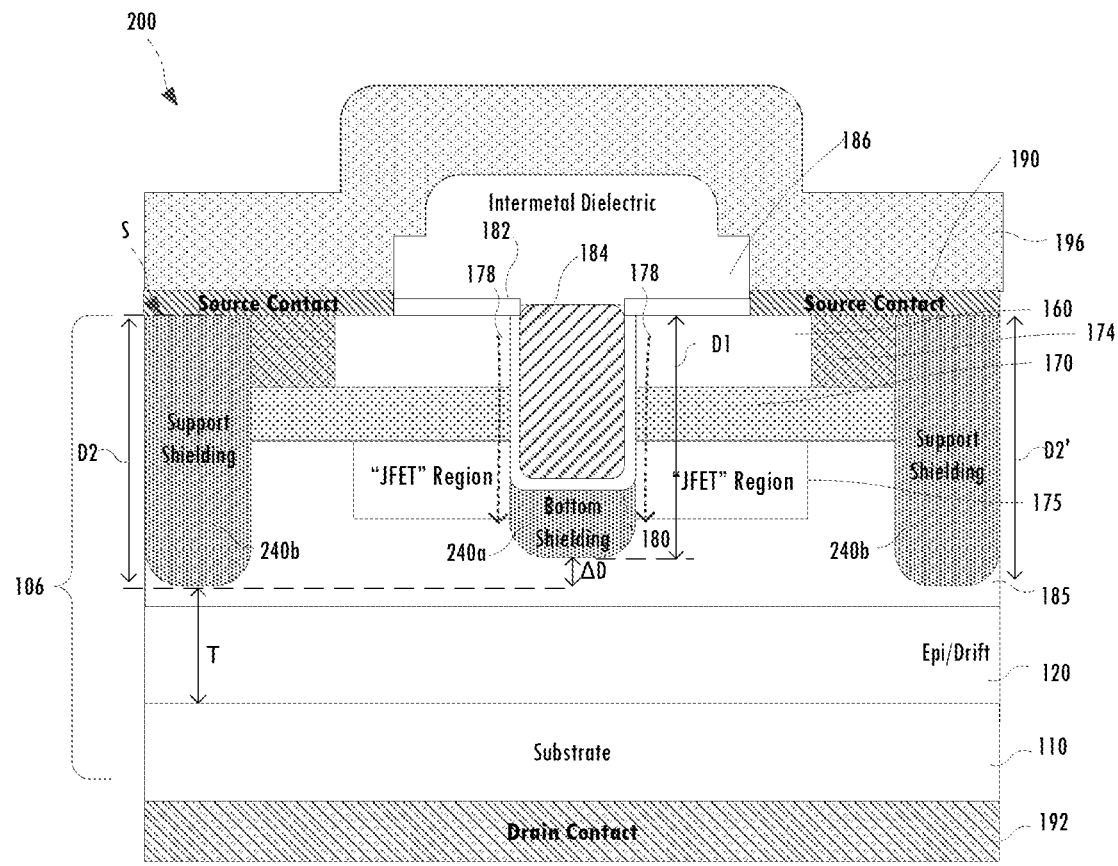
FIG. 2 is a schematic cross-sectional view illustrating an example unit cell of a gate trench power semiconductor device including bottom shielding structures below the gate trenches and support shielding structures spaced apart from sidewalls of the gate trenches according to some embodiments of the present invention.

In some embodiments, the support shielding structures or regions are provided adjacent the JFET portions 175 of the drift region 120, which are under and/or adjacent the gate trench 180. FIG. 2 is a is a schematic cross-sectional view illustrating an example unit cell of a power semiconductor device 200 including bottom shielding structures 240a below the gate trenches 180 and support shielding structures 240b spaced apart from sidewalls of the gate trenches 180 according to some embodiments of the present invention. Elements, layers, or regions similar to those of the semiconductor layer structure 106 described herein are indicated by like numbers.

As shown in FIG. 2, in a trenched vertical power semiconductor device 200, a JFET region 175 may include the upper portions of the drift region 120 that are adjacent the gate trenches 180 and under the well regions. A primary bottom shielding structure 240a is provided under a bottom surface of the gate trench 180, and first and second support shielding structures 240b are provided on opposing sides of and spaced apart from the sidewalls of the gate trench 180, such that the JFET regions 175 extend at least partially between each support shielding structure 240b and the bottom shielding structure 240a. The bottom and support shielding structures 240a and 240b (collectively, referred to as shielding structures) extend towards the substrate 110 beyond the gate trench 180 (i.e., extend closer to the substrate 110 than the gate trench 180). Shielding connection patterns may be connected to the shielding structures 240a, 240b and the source contacts 190 (e.g., at the top of the device 200), or the source contacts 190 may be otherwise connected to the shielding structures 240a, 240b to allow the shielding structures 240a, 240b to be electrically grounded.

The support shielding structures 240b may differ from the bottom shielding structures 240a (e.g., in material composition, distance or depth of extension from a surface S of the semiconductor layer structure 106 toward the substrate 110, and/or dopant concentration) so as to provide greater protection for the gate insulating layer 182 along the gate trench 180 (e.g., at corners of the bottom surface of the gate trench 180), for example, by providing a lower resistance current path under avalanche breakdown conditions. In some embodiments, the support shielding structures 240b may extend towards the substrate 110 to a depth D2 that is substantially equal to the depth D1 of bottom shielding structures 240a (i.e., where D2=D1). In some embodiments, the support shielding structures 240b may extend towards the substrate 110 to a greater depth D2 than the depth D1 of bottom shielding structures 240a. For example, the support shielding structures 240b may extend toward the substrate 110 beyond the bottom shielding structures 240a by a depth ΔD of about 0.1 microns to about 1 micron (e.g., about 0.3 microns to about 0.7 microns, for example, about 0.5 microns). That is, a difference ΔD between the depth D2 of the support shielding structures 240b and the depth D1 of the bottom shielding structures D1 may be less than about 0.1 microns to about 1 micron. Depths or distances of extension into the drift region 120 as described herein may be along the vertical direction in the drawings, and may be relative to a (top) surface S of the semiconductor layer structure 106. The depth D2 of the support shielding structures 240b may be sufficient to reduce or prevent avalanche breakdown at the bottom of the gate trench 180. In some embodiments, the support shielding structures 240b may extend from the surface S of the semiconductor layer structure 106 to a depth D2 that is about 1 micron to about 10 microns (e.g., about 3 microns to about 7 microns, for example, about 5 microns) towards the substrate 110.

Also, the shapes of the support shielding structures 240b may differ from the bottom shielding structures 240a and/or from the trenches 180 in some embodiments. For example, the widths of the support shielding structures 240b (along the horizontal or lateral direction) may differ from the width of the trenches 180 (and/or bottom shielding structures 240a extending under the trenches 180). That is, while illustrated as substantially similar in width, the first and second support shielding structures 240b may be wider or narrower than the gate trenches 180 in some embodiments.

The support shielding structures 240b may define a p-n junction (e.g., a body diode) with the drift region 120. A spacing T between the support shielding structures 240b and the substrate 110 (e.g., defined by a portion of the drift region 120 therebetween) may correspond to a breakdown voltage of the device 200. For example, the support shielding structures 240b and/or the bottom shielding structures 240a may be separated from the substrate 110 by a spacing T of about 1 micron to about 100 microns (e.g., about 30 microns to about 70 microns, for example, about 50 microns). The spacing T may vary, for example, based on the materials and/or dopant concentrations of the shielding structures 240a, 240b.

In some embodiments, the support shielding structures 240b may have a lower resistance than the bottom shielding structure 240a. For example, the support shielding structures 240b may contact the source contact 190 over a greater length (e.g., along a direction into the page) than the bottom shielding structure 240a (which may only connect to the source intermittently along its length), thereby reducing resistance. The support shielding structures 240b may be formed of a same or different material and/or with a similar or different dopant concentration than the bottom shielding structures 240a. In some embodiments, the shielding structures 240a, 240b may be defined by one or more implantation processes, with substantially uniform concentration or stepwise or continuous grading, and may extend to contact the source contact 190 for connection to electrical ground within the unit cell. The support shielding structures 240b may include a concentration of dopants of the second conductivity type of about $1\times10^{17}$ to about $1\times10^{20}$ cm$^{-3}$, e.g., about $5\times10^{17}$ to about $5\times10^{19}$ cm$^{-3}$, or about $1\times10^{18}$ to about $1\times10^{19}$ cm$^{-3}$. The dopant concentration of the support shielding structures 240b may be higher than that of the well regions 170 (e.g., more than about 10 times higher; for example, about 100 times higher), and may be similar to or higher than the dopant concentration of the bottom shielding structures 240a. The dopant concentrations of the shielding structures 240a, 240b may vary based on implementation of the fabrication process and/or device design, as shown for example in the shielding structures 340a, 340b of the method embodiments of FIGS. 5A-5F and 6A-6H.

In some embodiments, the shielding structures 240a, 240b may be formed of different materials than the drift region 120, e.g., a semiconductor material with lower resistance than the semiconductor material of the drift region 120. For example, in embodiments where the drift region 120 is an n-type material (e.g., SiC), the support shielding structures 240b and/or the bottom shielding structures 240a may be p-type material(s) (e.g., nickel oxide (p-NiO), polysilicon (poly-Si), gallium nitride (p-GaN), gallium oxide (p-Ga$_2$O$_3$)). In embodiments where the drift region 120 is a p-type material, the support shielding structures 240b and/or the bottom shielding structures 240a may be n-type material(s) (e.g., n-SiC, n-Si, n-GaN). Forming the shielding structures 240a and/or 240b of different material(s) of the opposite conductivity type than the drift region 120 may thus define respective p-n heterojunctions or body diodes in the drift region 120.

Shielding structures formed of different material(s) that define heterojunctions with the drift region 120 may also differ in ability to withstand repeated breakdown events (in comparison to implanted shielding structures). For example, heterojunction-based shielding structures (also described herein with reference to shielding structures 340a' and 340b') may be formed to provide a lower resistance and/or to extend to greater depths than the implant-based shielding structures (e.g., shielding structures 340a and 340b herein) to increase effectiveness. That is, relative to implant-based shielding regions, heterojunction-based shielding structures may provide advantages with respect to resistance and/or depth control (i.e., can be formed with lower resistance and/or greater depth than implanted shielding structures).

In addition or alternatively, the support shielding structures 240b may be formed of different materials than the bottom shielding structures 240a. For example, the bottom shielding structures 240a may be implanted regions of (and thus, may be of the same material as) the drift region 120, while the support shielding structures 240b may be formed of a different material than the drift region 120, or vice versa, as shown for example in the shielding structures 340a, 340b and 340a', 340b' of the device embodiments of FIGS. 3C-3D and 4A-4D. Forming the shielding structures 240a and/or 240b of different materials than one another may provide improved protection of the gate insulating layer 182. For example, forming the support shielding structures 240b of different materials of the second conductivity type (e.g., p-NiO, p-poly-Si, p-GaN, p-Ga$_2$O$_3$) may provide a lower resistance (in some instances, a few orders of magnitude lower) than some implanted bottom shielding structures 240a of the second conductivity type (e.g., P+ regions), and thus, a lower resistance current path under avalanche breakdown conditions. That is, the shielding structures 240a, 240b may be formed of different materials than the drift region 120, and/or may be formed of different materials than one another.

The shape and/or depths of the support shielding structures 240b may also allow for variations in shape and/or depth of the bottom shielding structures 240a while still providing desired avalanche breakdown characteristics. For example, in some embodiments, due to the greater protection of the gate oxide 182 provided by the support shielding structures 240b, the bottom shielding structure 240a may extend along only a portion of (i.e., may be narrower than) the bottom surface of the gate trench 180, which may increase the available area for conduction 178 at the bottom corners of the gate trench 180 (such that the JFET region 175 may extend underneath the outer edges of the gate trench 180, in addition to along the trench sidewalls). In contrast, in some embodiments, the bottom shielding structure 240a may extend along an entirety of (or may extend laterally beyond or wider than) the bottom surface of the gate trench 180, and a dopant concentration of the JFET region 175 may be increased to maintain the desired conduction 178. The width of the bottom shielding structure 240a (i.e., along the bottom of the gate trench 180) may be varied based on the masking, implantation, deposition, and/or other fabrication operations that are used to form the shielding structures 240a and 240b.

More generally, the support shielding structures 240b may be formed with a different depth, dopant concentration, and/or material than the bottom shielding structures 240a, one or more of which may be configured to reduce or prevent avalanche breakdown at the bottom of the gate trench 180. Example unit cells of power semiconductor devices 300a-300d and 400a-400d including various combinations of bottom shielding structures 340a, 340a' and support shielding structures 340b, 340b' are illustrated in FIGS. 3A-3D and 4A-4D.

In the examples of FIGS. 3A-3D and 4A-4D, a simplified semiconductor layer structure 106 (e.g., without the JFET regions 175, CSL 185, etc.) is shown for ease of illustration, but these and other well-known elements may be understood to be present although not specifically shown. Likewise, elements, layers, and/or regions of the devices 300a-300d and 400a-400d similar to those discussed above are indicated by like numbers, and description of such elements, layers, and/or regions may be omitted for brevity. The bottom shielding structures 340a, 340a' and support shielding structures 340b, 340b' may include characteristics similar to those of the bottom shielding structures 240a and support shielding structures 240b, respectively, unless otherwise mentioned.

Figure 3A:
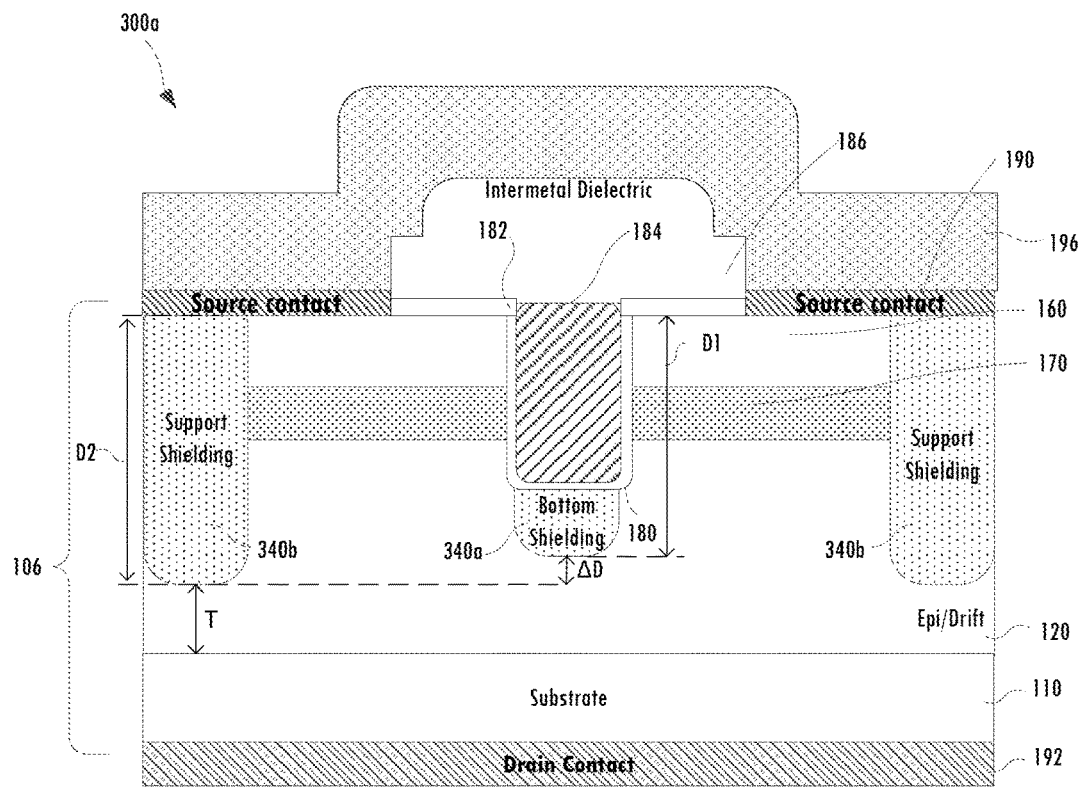
FIGS. 3A, 3B, 3C, and 3D are schematic cross-sectional views illustrating example unit cells of gate trench power semiconductor devices including bottom shielding structures and support shielding structures in various combinations of different dopant concentrations, depths, and/or material compositions according to some embodiments of the present invention.

In particular, as shown in FIG. 3A, a power semiconductor device 300a includes bottom shielding structures 340a and support shielding structures 340b provided by implanted regions of the second conductivity type (e.g., p-type) in the first conductivity type drift region 120 (e.g., n-type). The support shielding structures 340b may differ from the bottom shielding structures 340a (e.g., in depth of extension toward the substrate 110 and/or dopant concentration), depending on the fabrication processes used. For example, a first ion implantation process may be performed to define the bottom shielding structures 340a with a first depth D1 and a first concentration of the second conductivity type dopants, and a second ion implantation process may be performed to define the support shielding structures 340b with a second depth D2 (e.g., greater than or equal to the first depth D1) and a second concentration of the second conductivity type dopants (e.g., lower than or equal to the first concentration). In embodiments where the support shielding structures 340b are implanted regions (such as in FIGS. 3A, 3C, and 4A), the support shielding structures 340b may effectively provide the heavily doped regions 174 of the second conductivity type, which may be omitted. In FIG. 3A, the bottom shielding structure 340a is illustrated as being narrower than (i.e., extending only partially along) the bottom surface of the gate trench 180 by way of example, but may be equal to or wider than the bottom surface of the gate trench 180 depending on the fabrication processes used. Methods of fabricating the device 300a including implanted bottom shielding structures 340a and support shielding structures 340b are discussed below with reference to FIGS. 5A-5F and 6A-6H.

Figure 3B:
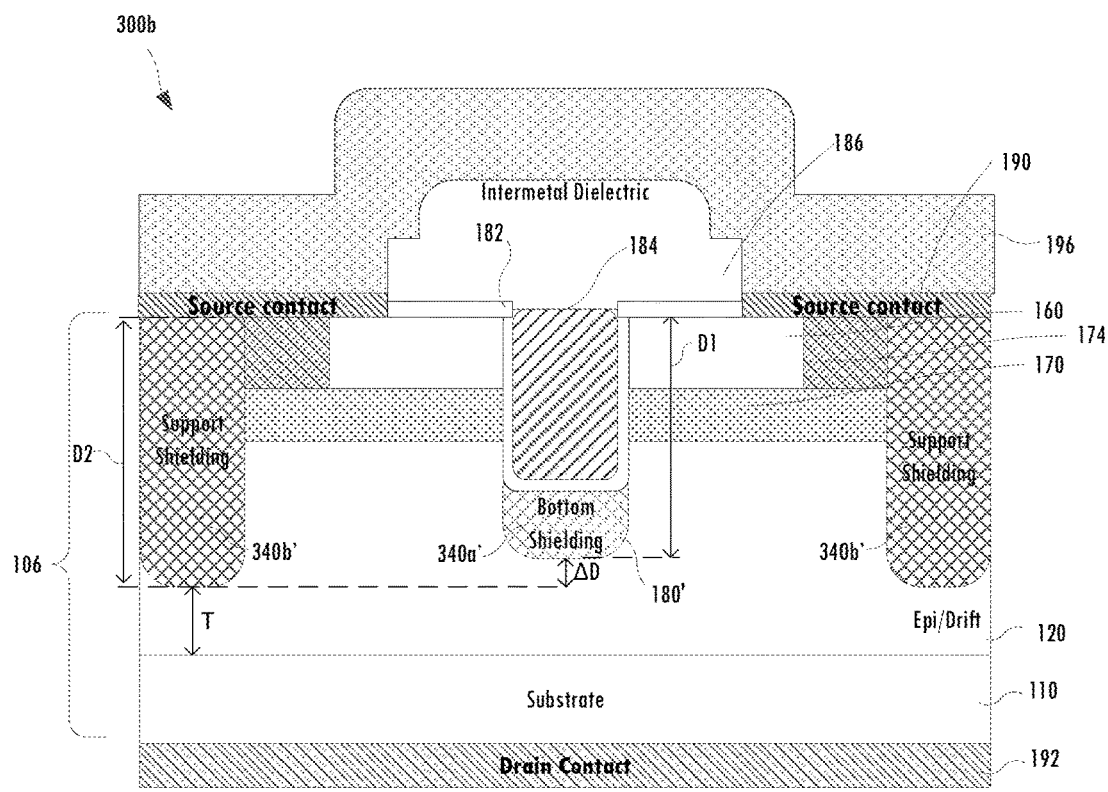

As shown in FIG. 3B, a power semiconductor device 300b includes bottom shielding structures 340a' and support shielding structures 340b' of one or more different materials than the drift region 120. In particular, the bottom shielding structures 340a' and support shielding structures 340b' include materials of the second conductivity type (e.g., p-type), thereby forming respective heterojunctions with the first conductivity type drift region 120 (e.g., n-type). For example, the drift region 120 may be formed of an n-type material (e.g., SiC), and the bottom shielding structures 340a' and the support shielding structures 340b' may be formed of p-type materials (e.g., p-NiO, p-poly-Si, p-GaN, p-Ga$_2$O$_3$), for instance, using one or more deposition operations. The support shielding structures 340b' may differ from the bottom shielding structures 340a' (e.g., in depth of extension toward the substrate 110 and/or material composition), depending on the fabrication processes used. For example, in some embodiments, the bottom shielding structures 340a' may be formed of a first material with a first depth D1 using a first etching and deposition process, and the support shielding structures 340b' may be formed of a second material (e.g., the same as or different than the first material) with a second depth D2 (e.g., greater than or equal to the first depth D1) using a second etching and deposition process, such that the shielding structures 340a' and 340b may be formed of different materials and/or different depths from one another (e.g., the bottom shielding structures 340a' may be p-poly-Si and the support shielding structures 340b' may be p-NiO). In embodiments where the support shielding structures 340b' define heterojunctions with the drift region 120 (such as in FIGS. 3B, 3D, and 4B, 4C, and 4D), the support shielding structures 340b', the heavily doped regions 174, and the source regions 160 may each have contact (e.g., ohmic contact) with the source contact 190. Methods of fabricating the device 300b including bottom shielding structures 340a' and support shielding structures 340b' defining heterojunctions with the drift region 120 are discussed below with reference to FIGS. 7A-7F and 8A-8H.

Figure 3C:
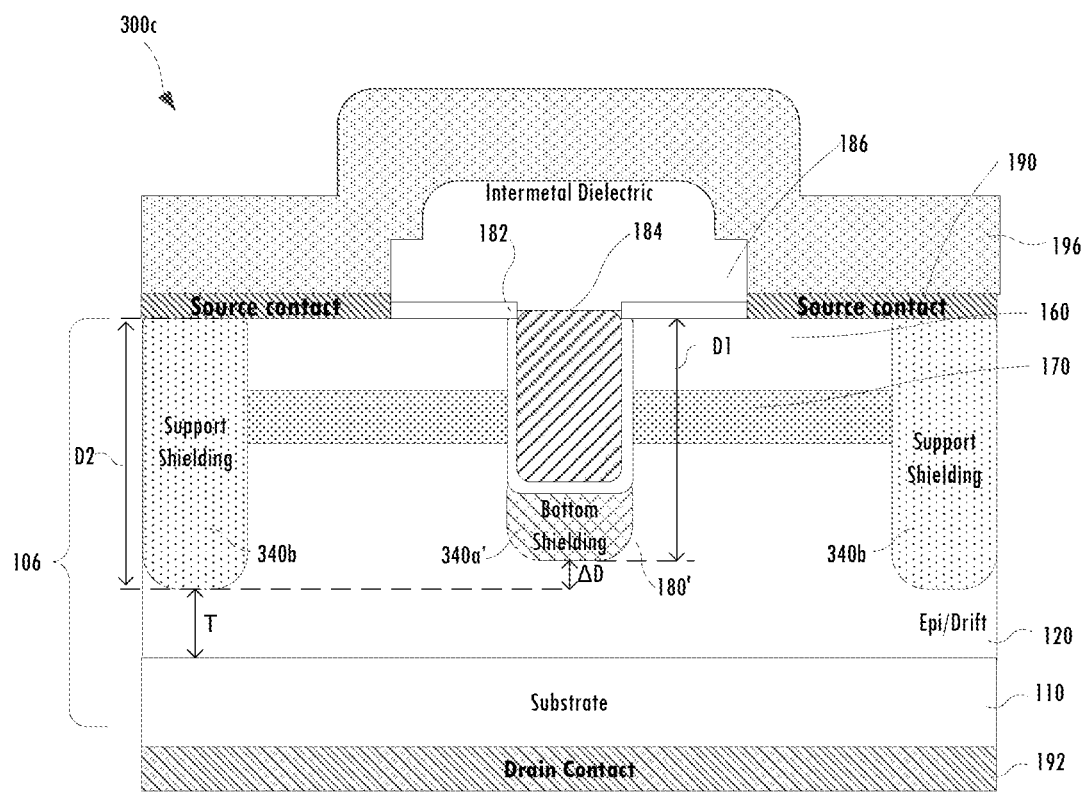

FIG. 3C illustrates a power semiconductor device 300c including support shielding structures 340b provided by implanted regions of the second conductivity type (e.g., p-type) in combination with bottom shielding structures 340a' of different second conductivity type material(s) than the first conductivity type drift region 120 (e.g., n-type), and thus, different material(s) than the implanted support shielding structures 340b. The bottom shielding structures 340a' define heterojunctions with the drift region 120 under the bottom surfaces of gate trenches 180'. The support shielding structures 340b and the bottom shielding structures 340a' may be formed using different fabrication operations (e.g., ion implantation and deposition, respectively), and thus the depth D2 and of the support shielding structures 340b may be the same as or different than the depth D1 of the bottom shielding structures 340a', depending on the respective fabrication processes used.

Figure 3D:
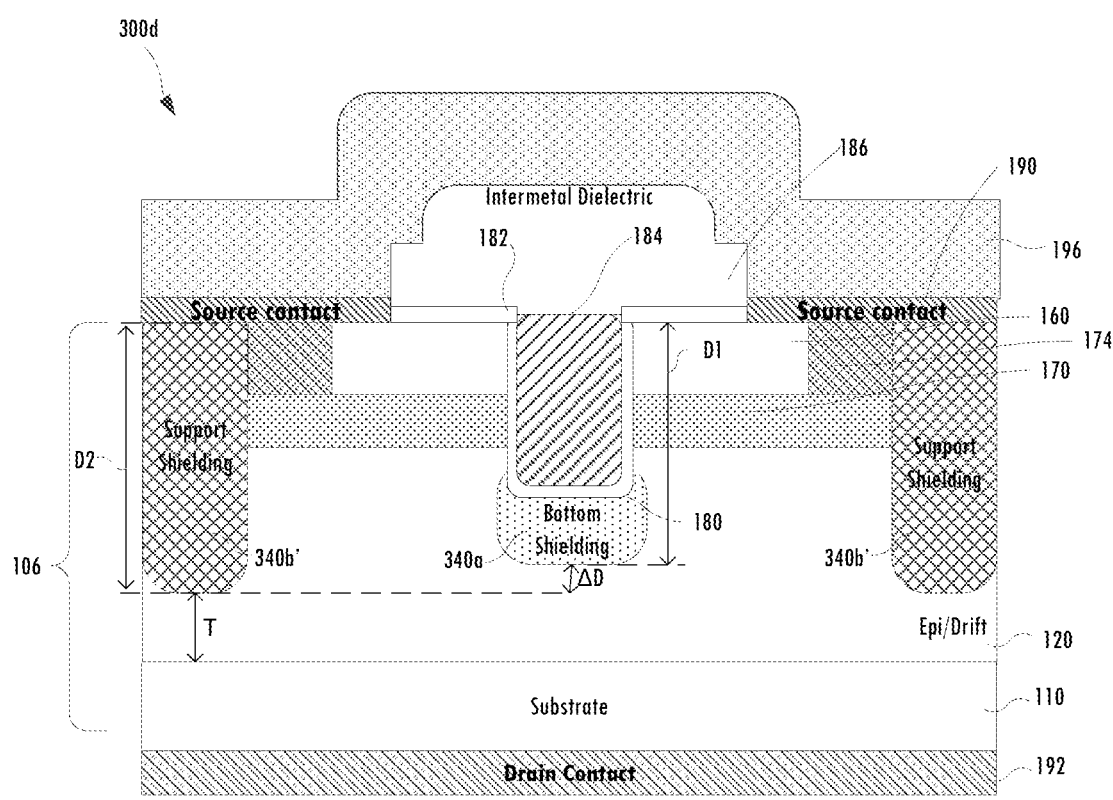

FIG. 3D illustrates a power semiconductor device 300d including bottom shielding structures 340a provided by implanted regions of the second conductivity type (e.g., p-type) in combination with support shielding structures 340b' of different second conductivity type material(s) than the first conductivity type drift region 120 (e.g., n-type). The support shielding structures 340b' define heterojunctions with the drift region 120 on opposing sides of and spaced apart from sidewalls of the gate trench 180. The support shielding structures 340b' and the bottom shielding structures 340a may be formed using different fabrication operations (e.g., deposition and ion implantation, respectively), and thus the depth D2 of the support shielding structures 340b' may be the same as or different than the depth D1 of the bottom shielding structures 340a, depending on the respective fabrication processes used. In FIG. 3D, the bottom shielding structure 340a is illustrated as being wider than (i.e., laterally extending beyond) the bottom surface of the gate trench 180 by way of example, but may be equal to or narrower than the bottom surface of the gate trench 180 depending on the fabrication processes used.

Figure 4A:
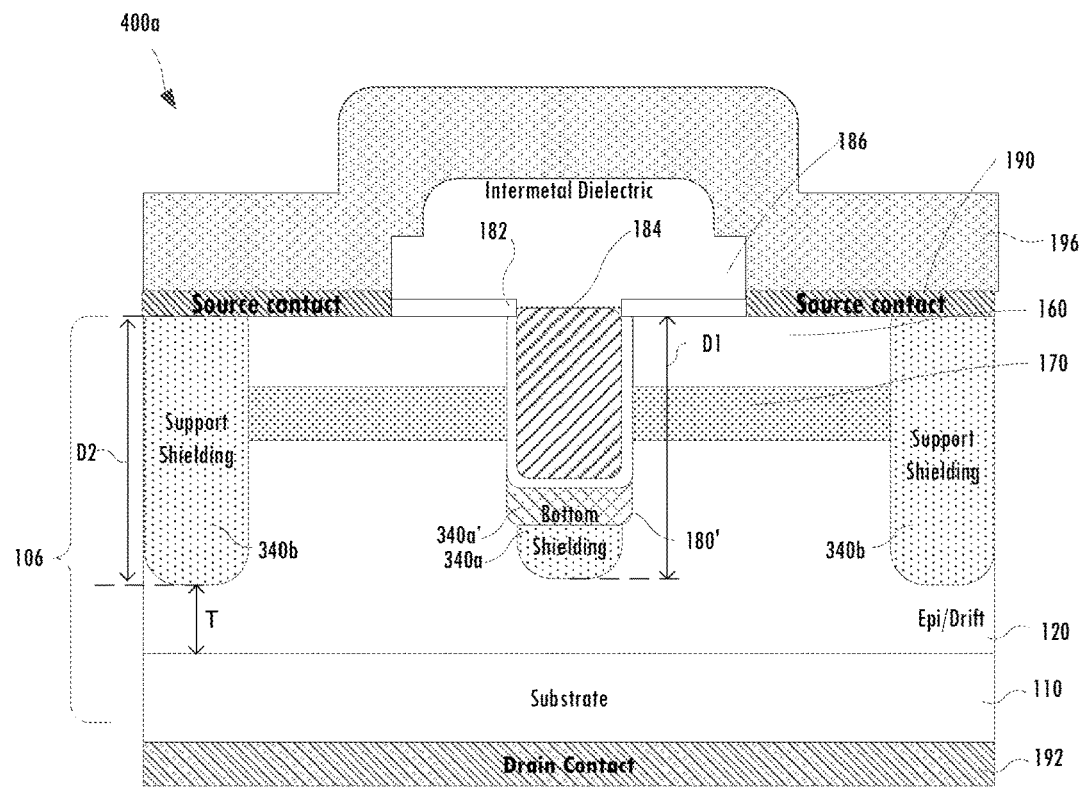
FIGS. 4A, 4B, 4C, and 4D are schematic cross-sectional views illustrating example unit cells of gate trench power semiconductor devices including bottom shielding structures and support shielding structures of different dopant concentrations and different material compositions according to some embodiments of the present invention.

FIG. 4A illustrates a power semiconductor device 400a including support shielding structures 340b provided by implanted regions of the second conductivity type (e.g., p-type), first bottom shielding structure portions 340a provided by implanted regions of the second conductivity type, and second bottom shielding structure portions 340a' of different second conductivity type material(s) than the drift region 120. The second bottom shielding structure portions 340a' define heterojunctions with the drift region 120 under the bottom surfaces of the gate trenches 180'. The support shielding structures 340b and the second bottom shielding structure portions 340a' may be formed using different fabrication operations (e.g., ion implantation and deposition, respectively). The support shielding structures 340b and the first bottom shielding structure portions 340a may be formed using the same or different implantation operations. As such, the depth D2 and/or dopant concentration of the support shielding structures 340b may be the same as or different than the depth D1 and/or dopant concentration of the first bottom shielding structure portions 340a, depending on the fabrication processes used. Likewise, in FIG. 4A, the first bottom shielding structure portions 340a are illustrated as being narrower than the bottom surfaces of the gate trenches 180' by way of example, but may be equal to or wider than the bottom surface of the gate trenches 180' depending on the fabrication processes used.

Figure 4B:
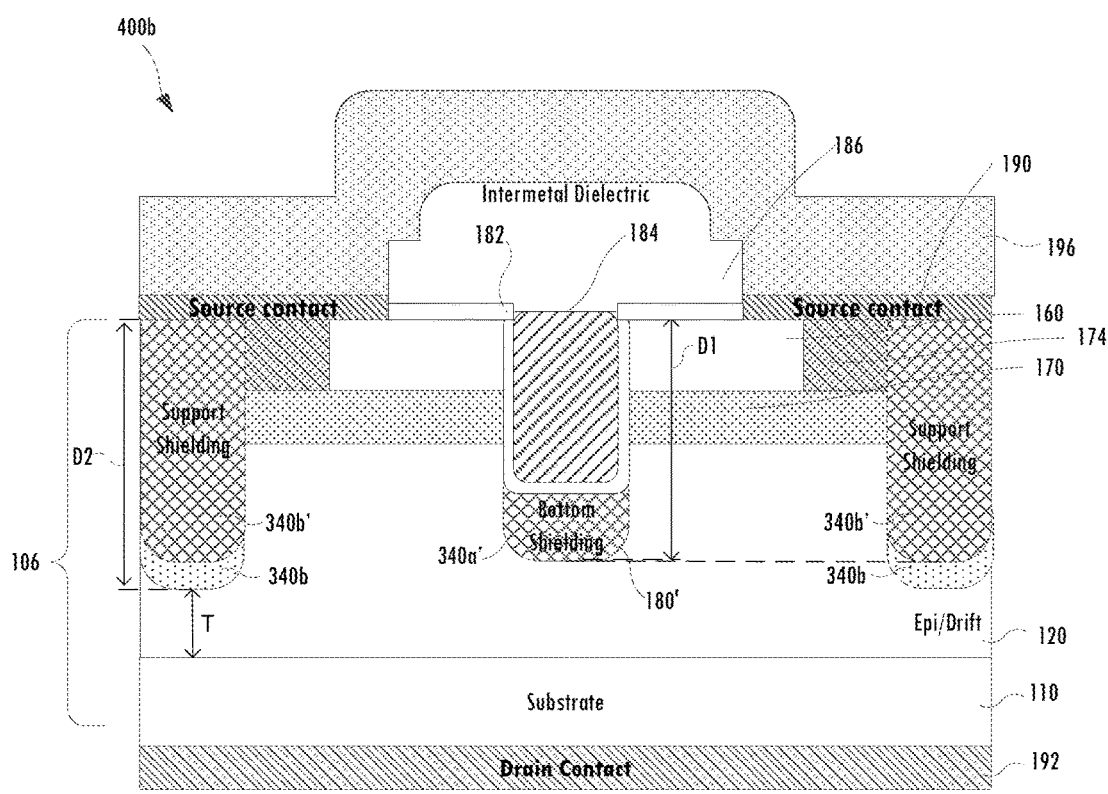

FIG. 4B illustrates a power semiconductor device 400b including first support shielding structure portions 340b provided by implanted regions of the second conductivity type. Second support shielding structure portions 340b', as well as the bottom shielding structures 340a', include different second conductivity type material(s) than the first conductivity type drift region 120. The bottom shielding structures 340a' and the second support shielding structure portions 340b' define heterojunctions with the drift region 120 (under the bottom surfaces of the gate trenches 180' and laterally spaced apart from opposing sidewalls of the gate trench 180', respectively). The bottom shielding structures 340a' and the second support shielding structure portions 340b' may be formed using the same or different fabrication operations (e.g., the same or different deposition steps), and thus, may be the same as or may differ from one another (e.g., in depth of extension toward the substrate 110 and/or material composition), depending on the fabrication processes used. The first support shielding structure portions 340b may be formed using different fabrication operations (e.g., one or more ion implantation processes) than the shielding structures 340a', 340b'. The depth D2 of the first support shielding structure portions 340b may be the same as or different than the depth D1 of the bottom shielding structures 340a', depending on the fabrication processes used.

Figure 4C:
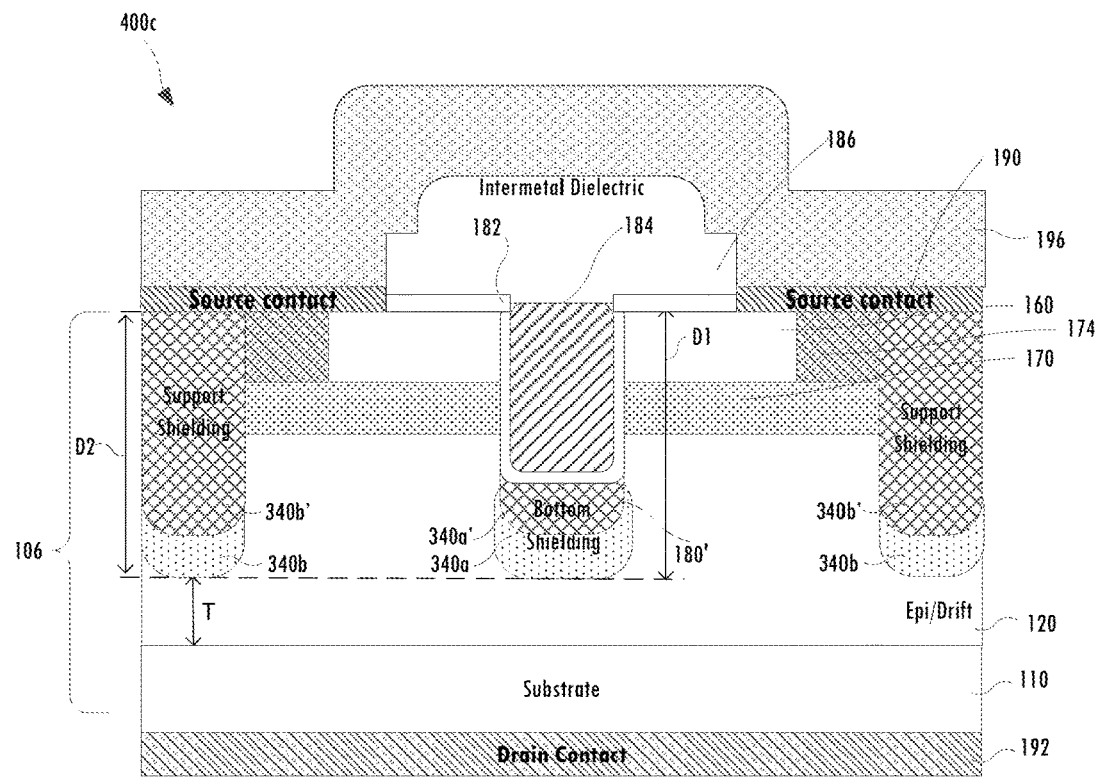

FIG. 4C illustrates a power semiconductor device 400c including bottom shielding structures and support shielding structures that each include implanted and heterojunction regions. In particular, the bottom shielding structures and support shielding structures each include first portions 340a and 340b provided by implanted regions of the second conductivity type, and second portions 340a' and 340b' of different second conductivity type material(s) than the drift region 120. The second portions 340a' and 340b' define heterojunctions with the drift region 120 (under the bottom surfaces of the gate trench 180' and laterally spaced apart from opposing sidewalls of the gate trench 180', respectively). The first portions 340a and 340b extend from the second shielding structure portions 340a' and 340b' toward the substrate 110 to depths D1 and D2, respectively. The first portions 340a and 340b may be formed using the same or different fabrication operations (e.g., the same or different ion implantation processes), and thus, may be the same as or may differ from one another (e.g., in depth of extension toward the substrate 110 and/or dopant concentration), depending on the fabrication processes used. The second portions 340a' and 340b' may be formed using the same or different fabrication operations (e.g., the same or different deposition steps), and thus, may be the same as or may differ from one another (e.g., in depth of extension toward the substrate 110 and/or material composition), depending on the fabrication processes used. As such, the depth D2 of the first and second portions 340b and 340b' of the support shielding structures may be the same as or different than the depth D1 of the first and second portions 340a and 340a' of the bottom shielding structures. In FIG. 4C, the first portion 340a of the bottom shielding structures is illustrated as being wider than (i.e., laterally extending beyond) the bottom surface of the gate trench 180' by way of example, but may be equal to or narrower than the bottom surface of the gate trench 180' depending on the fabrication processes used.

Figure 4D:
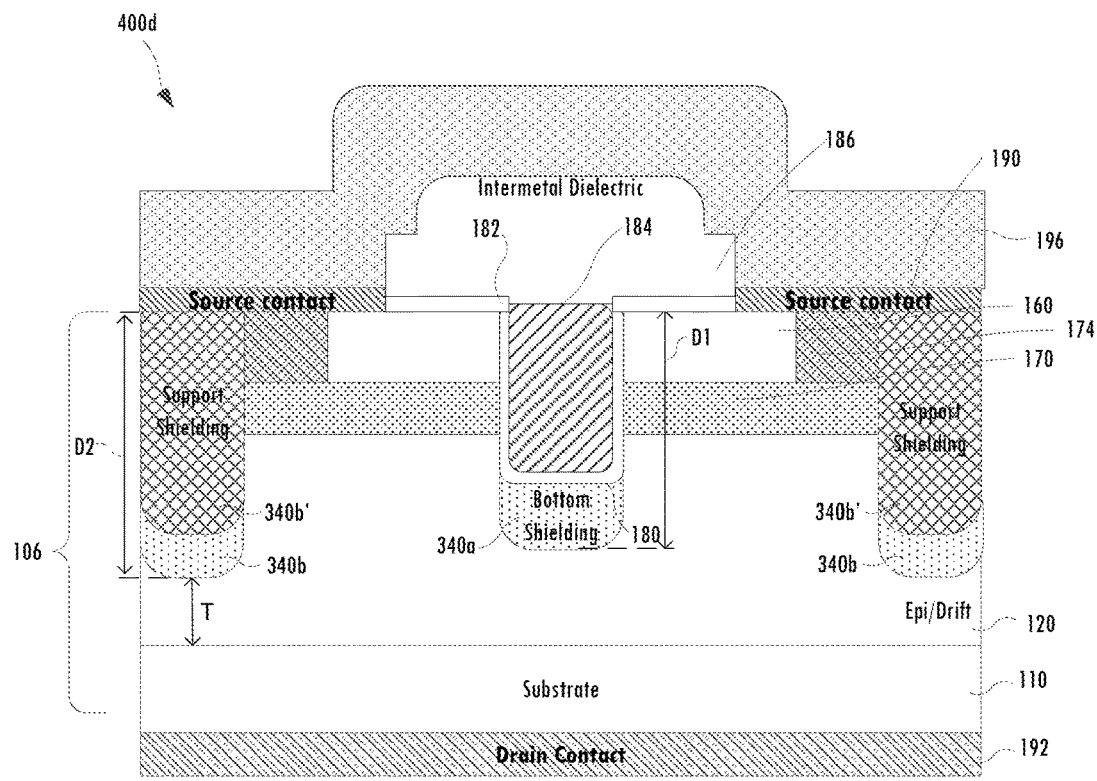

FIG. 4D illustrates a power semiconductor device 400d including bottom shielding structures 340a provided by implanted regions of the second conductivity type (e.g., p-type). First support shielding structure portions 340b are provided by implanted regions of the second conductivity type, and a second support shielding structure portions 340b' are formed of different second conductivity type material(s) than the first conductivity type drift region 120. The second support shielding structure portions 340b' define heterojunctions with the drift region 120 that are laterally spaced apart from opposing sidewalls of the gate trenches 180. The bottom shielding structures 340a and the first support shielding structure portions 340b may be formed using the same or different fabrication operations (e.g., the same or different ion implantation processes), and thus, may be the same as or may differ from one another (e.g., in depth of extension toward the substrate 110 and/or dopant concentration), depending on the fabrication processes used. The second support shielding structure portions 340b' may be formed using different fabrication operations (e.g., one or more ion implantation processes) than the shielding structures 340a, 340b. The depth D2 of the first and second support shielding structure portions 340b and 340b' may be the same as or different than the depth D1 of the bottom shielding structure 340a.

FIGS. 5A-5F are schematic cross-sectional views illustrating example fabrication operations for forming power semiconductor devices including bottom shielding structures below the gate trenches and support shielding structures spaced apart from sidewalls of the gate trenches according to some embodiments of the present invention. In particular, FIGS. 5A-5F illustrate methods of forming the shielding structures 340a, 340b as implanted regions, with the bottom shielding structure 340a being formed prior to forming the gate trench 180, which may be referred to herein as a pre-trench shield implant process.

Figure 5A:
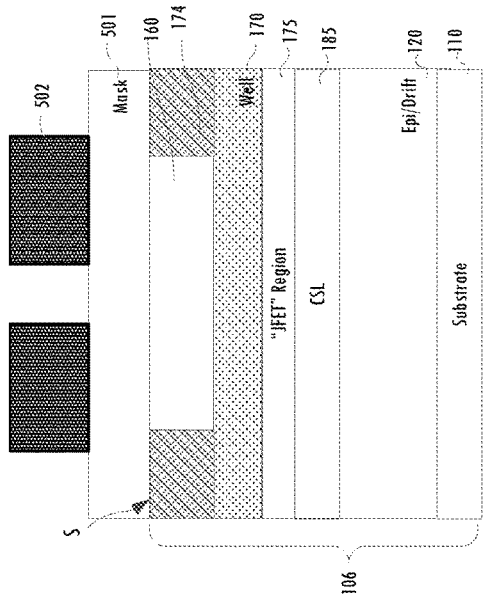
FIGS. 5A, 5B, 5C, 5D, 5E, and 5F are schematic cross-sectional views illustrating example fabrication operations for forming power semiconductor devices including bottom shielding structures below the gate trenches and support shielding structures spaced apart from sidewalls of the gate trenches according to some embodiments of the present invention.

As shown in FIG. 5A, a semiconductor layer structure 106 is provided. The semiconductor layer structure 106 includes a drift region 120 of a first conductivity type (e.g., n-type), a current spreading layer 185, a JFET region 175, a well region 170, and a source region 160, as described above. Heavily doped regions 174 of the second conductivity type are illustrated, but may be omitted in embodiments where the support shielding structures 340b are to be formed as implanted regions. The semiconductor layer structure 106 may include a substrate 110 and/or other layers. A mask layer 501 is formed on the surface S of the semiconductor layer structure 106, and a patterning layer 502 is formed on the mask layer 501.

Figure 5B:
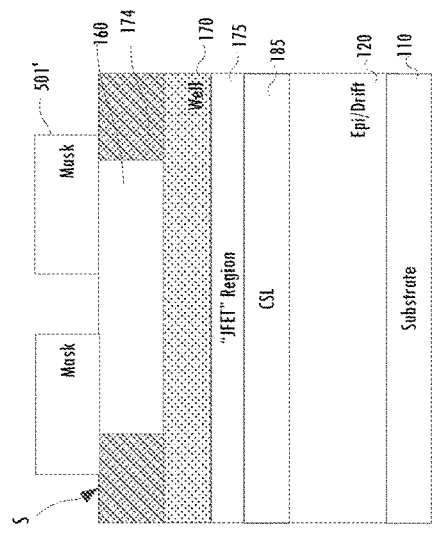
Figure 5C:
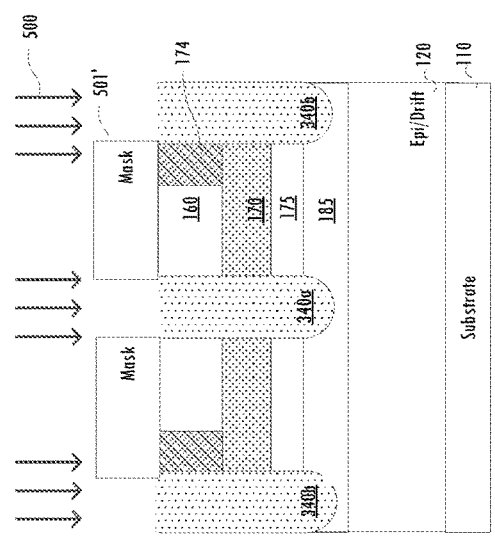

In FIG. 5B, the mask layer 501 is patterned (e.g., photolithographically) using the patterning layer 502 to form an implant mask pattern 501' including openings therein exposing portions of the surface S of the semiconductor layer structure 106. In FIG. 5C, one or more ion implantation processes 500 are performed to implant dopants of the second conductivity type (e.g., p-type) into the exposed portions of the surface S using the mask pattern 501' as an implantation mask to form shielding structures 340a and 340b extending into the drift region 120 toward the substrate 100. A dose and/or implantation energy of the implantation process(es) 500 may be controlled to form the shielding structures 340a and 340b with desired dopant concentrations and/or depths (e.g., D1 and D2) relative to the surface S (e.g., with higher implantation energies resulting in greater depths). The dopant concentrations of the shielding structures 340a and/or 340b may be substantially uniform or graded (e.g., stepwise or continuous).

The examples of FIGS. 5A to 5C illustrate a single mask 501' and high energy ion implantation process 500 to form the bottom shielding structures 340a and the support shielding structures 340b at the same time or in the same process step, such that the shielding structures 340a, 340b may have the same dopant concentrations and/or the same depths (i.e., D1=D2) relative to the surface S of the semiconductor layer structure 106. However, it will be understood that embodiments described herein are not limited to a single masking and/or implantation process, and that multiple masking and implantation operations may be sequentially performed with different mask shapes to expose different portions of the surface S, different implantation energies, and/or different dosing (e.g., one or more of FIG. 5A, 5B, or 5C may be repeated or iterated), such that the bottom shielding structures 340a and the support shielding structures 340b may have different shapes, different depths (i.e., D1≠D2) and/or different dopant concentrations from one another.

Figure 5D:
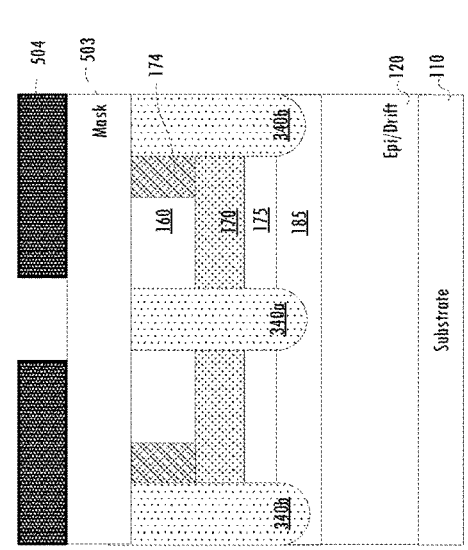
Figure 5E:
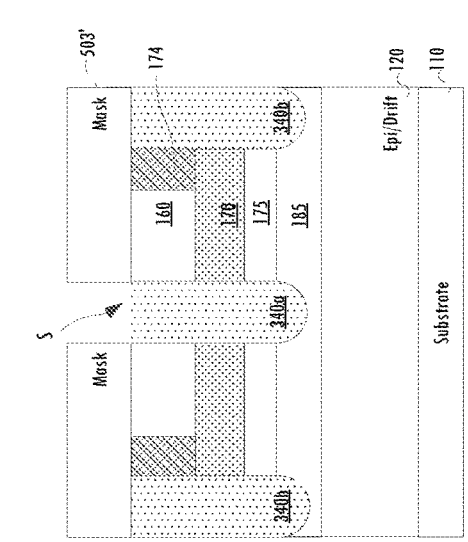
Figure 5F:
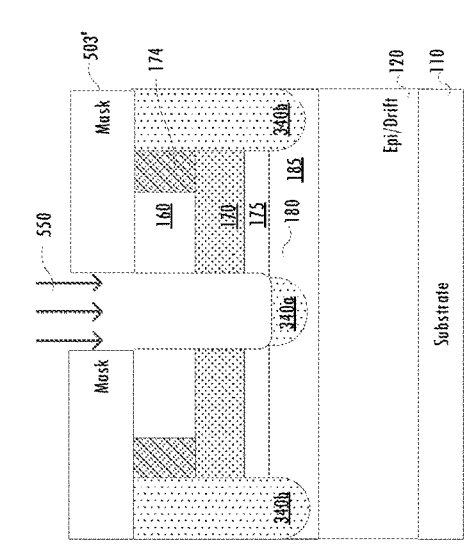

In FIG. 5D, the mask 501' is removed, an etching mask layer 503 (e.g., an oxide layer) is formed on the surface S of the semiconductor layer structure 106, and a patterning layer 504 is formed on the etching mask layer 503. In FIG. 5E, the etching mask layer 503 is patterned using the patterning layer 504 to form an etch mask pattern 503' including openings therein exposing portions of the surface S of the semiconductor layer structure 106 between the support shielding structures 340b. In FIG. 5F, an etching process 550 is performed to selectively etch the portions of the surface S exposed by the etching mask pattern 503', thereby forming gate trenches 180 extending into the drift region 120 between and spaced apart from the support shielding structures 340b. The bottom shielding structures 340a extend under and at least partially along the bottom surface of the gate trenches 180. The mask pattern 503' is removed, and gate oxide layer 182, gate electrode 184, source contacts 190, intermetal dielectric 186, and metal layer 196 may be subsequently formed provide the device 300a of FIG. 3A.

In the example operations of FIGS. 5A-5F, the support shielding structures 340b and the bottom shielding structures 340a are formed using the same implant process(es) 500, prior to forming the gate trenches 180. The support shielding structures 340b and the bottom shielding structures 340a may thus have the same or substantially similar depths and dopant concentrations. However, due to the etching of the gate trench 180 into the bottom shielding structure 340a formed by the pre-trench implant process, a distribution of dopants in the bottom shielding structure 340a (from the bottom surface of the trench 180 towards the substrate 110) may be more abrupt than that of the support shielding structures 340b (from the surface S towards the substrate 110).

FIGS. 6A-6H are schematic cross-sectional views illustrating example fabrication operations for forming power semiconductor devices including bottom shielding structures below the gate trenches and support shielding structures spaced apart from sidewalls of the gate trenches according to further embodiments of the present invention. In particular, FIGS. 6A-6H illustrate methods of forming the shielding structures 340a, 340b as implanted regions with the bottom shielding structure 340a being formed after the gate trench 180, which may be referred to herein as a post-trench shield implant process.

Figure 6A:
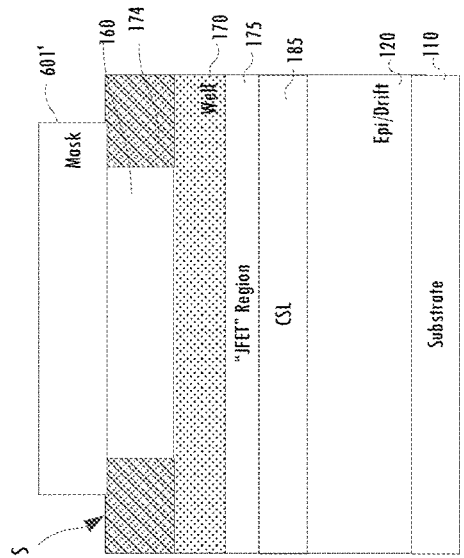
FIGS. 6A, 6B, 6C, 6D, 6E, 6F, 6G, and 6H are schematic cross-sectional views illustrating example fabrication operations for forming power semiconductor devices including bottom shielding structures below the gate trenches and support shielding structures spaced apart from sidewalls of the gate trenches according to further embodiments of the present invention.

As shown in FIG. 6A, a semiconductor layer structure 106 is provided. The semiconductor layer structure 106 includes a drift region 120 of a first conductivity type (e.g., n-type), a current spreading layer 185, a JFET region 175, a well region 170, and a source region 160, as described above. Heavily doped regions 174 of the second conductivity type are illustrated, but may be omitted in embodiments where the support shielding structures 340b are to be formed as implanted regions. The semiconductor layer structure 106 may include a substrate 110 and/or other layers. A mask layer 601 is formed on the surface S of the semiconductor layer structure 106, and a patterning layer 602 is formed on the mask layer 601.

Figure 6B:
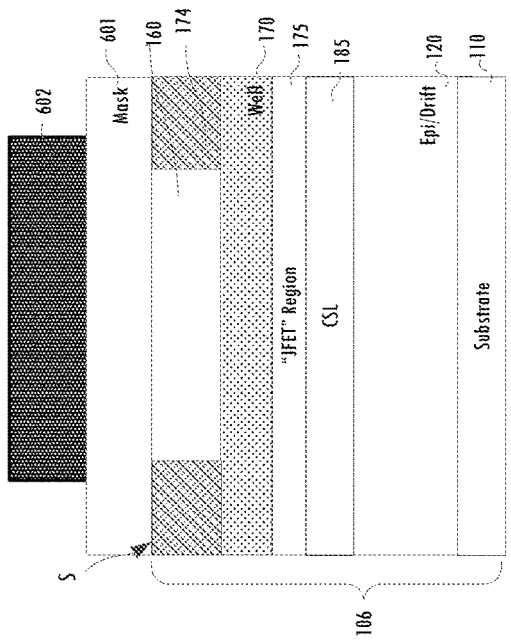
Figure 6C:
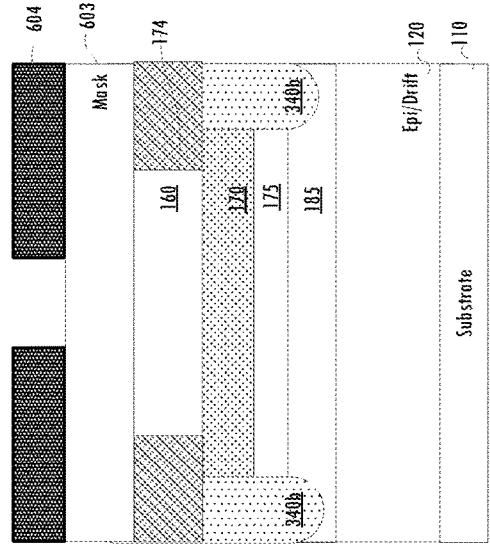

In FIG. 6B, the mask layer 601 is patterned (e.g., photolithographically) using the patterning layer 602 to form an implant mask pattern 601' including openings therein exposing portions of the surface S of the semiconductor layer structure 106. In FIG. 6C, one or more ion implantation processes 600 are performed to implant dopants of the second conductivity type (e.g., p-type) into the exposed portions of the surface S using the mask pattern 601' as an implantation mask to form support shielding structures 340b extending into the drift region 120 toward the substrate 100. A dose and/or implantation energy of the implantation process(es) 600 may be controlled to form the support shielding structures 340b with desired dopant concentrations and/or desired depths (e.g., D2) relative to the surface S. The dopant concentrations of the support shielding structures 340b may be substantially uniform or graded (e.g., stepwise or continuous).

Figure 6D:
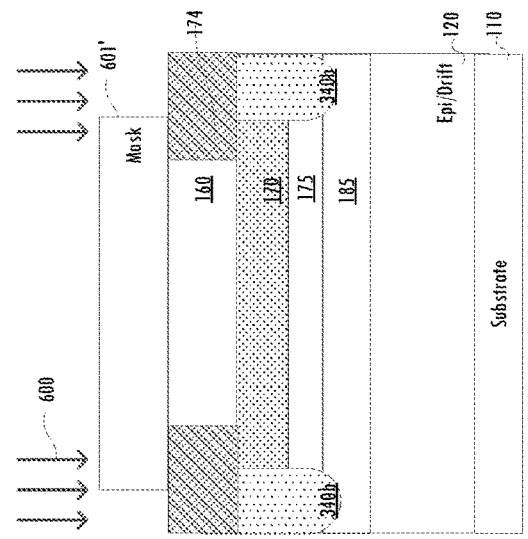
Figure 6E:
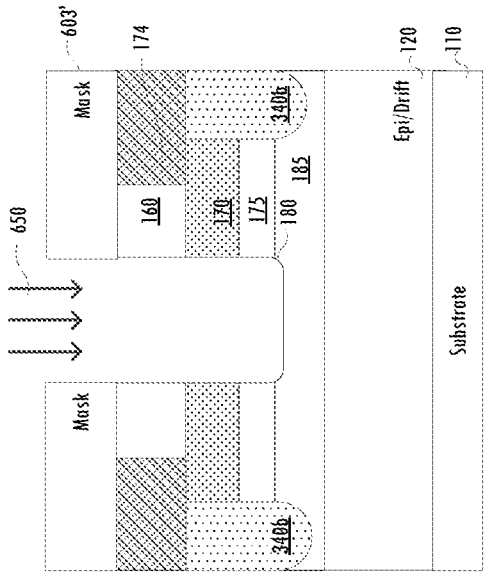

In FIG. 6D, the mask 601' is removed, an etching mask layer 603 (e.g., an oxide layer) is formed on the surface S of the semiconductor layer structure 106, and a patterning layer 604 is formed on the etching mask layer 603. In FIG. 6E, the etching mask layer 603 is patterned using the patterning layer 604 to form an etch mask pattern 603' including openings therein exposing portions of the surface S of the semiconductor layer structure 106 between the support shielding structures 340b. In FIG. 6F, an etching process 650 is performed to selectively etch the portions of the surface S exposed by the etching mask pattern 603', thereby forming gate trenches 180 extending into the drift region 120 between and spaced apart from the support shielding structures 340b.

Figure 6G:
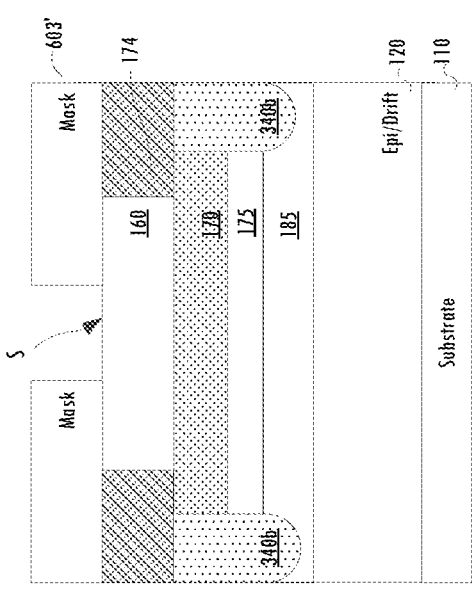
Figure 6F:
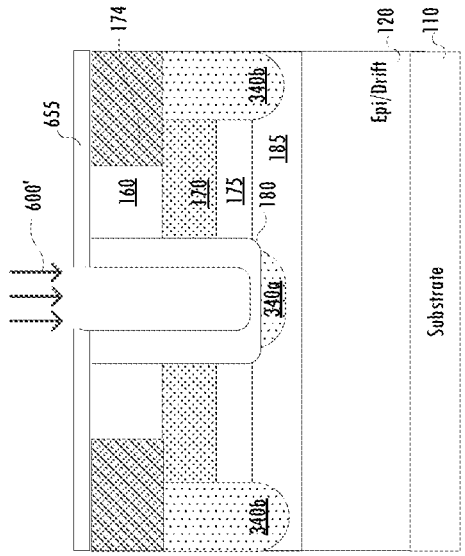

In FIG. 6G, a mask 655 (e.g., an oxide mask) is formed on sidewalls and on a bottom surface of the gate trenches 180. For example, the trenches 180 may be oxidized and/or a coating may be deposited along the sidewalls and bottom surface of the gate trenches 180 to form the mask 655. In some embodiments, portions of the mask 655 on the sidewalls may be formed thicker than portions of the mask 655 on the bottom surface of the gate trenches 180, for example, to protect the conducting sidewalls of the trench 180 from the implant process for forming the shielding structure 340a.

Figure 6H:
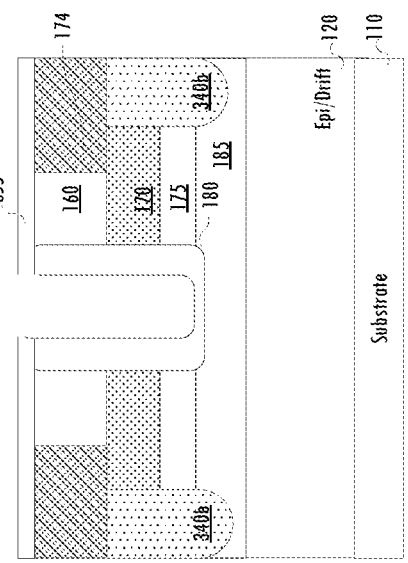

In FIG. 6H, one or more ion implantation processes 600' are performed to implant dopants of the second conductivity type into the bottom surface of the trenches 180 using the mask 655 as an implantation mask to form bottom shielding structures 340a under and extending at least partially along the bottom surface of the gate trenches 180. A dose and/or implantation energy of the implantation process(es) 600' may be controlled to form the bottom shielding structures 340a with desired dopant concentrations and/or desired depths (e.g., D1) relative to the surface S, and/or with dopant concentration that is substantially uniform or graded. The mask 655 is removed, and a gate oxide layer 182, gate electrode 184, source contacts 190, intermetal dielectric 186, and metal layer 196 may be subsequently formed provide the device 300a of FIG. 3A.

In the example operations of FIGS. 6A-6H, a first high energy implantation 600 is used to form the support shield structures 340b prior to forming the gate trenches 180, and the bottom shield structures 340a are formed using a second high energy implantation 600'. The dose and/or implantation energy of the second implantation 600' may be the same as or different than the first implantation 600. The operations shown in FIGS. 6A to 6H may thus be advantageous with respect to ease of forming the support shielding structures 340b with different depths, concentrations, and/or materials than the bottom shielding structures 340a. For example, the use of multiple implantation processes 600 and 600' may allow for selection of different implantation energies and/or dopant profiles for each of the first and second implantation processes, e.g., to form the support shield structures 340b extend to a greater depth and/or with a different dopant concentration than the bottom shield structures 340a. For example, the bottom shield structures 340a may be separately formed with similar or lower dopant concentration than the support shield structures 340b. The forming of the bottom shielding structure 340a after formation of the gate trench 180 may also result in a similar (e.g., Gaussian) distribution of dopants over the depths of the shielding structures 340a and 340b (from the bottom surface of the trench 180 towards the substrate 110 and from the surface S towards the substrate 110, respectively).

FIGS. 7A-7H are schematic cross-sectional views illustrating example fabrication operations for forming power semiconductor devices including bottom shielding structures below the gate trenches and support shielding structures spaced apart from sidewalls of the gate trenches according to still further embodiments of the present invention. In particular, FIGS. 7A-7H illustrate methods of forming the shielding structures 340a', 340b' of different material(s) than the drift region 120, with the bottom shielding structure 340a' being formed prior to forming the gate trench 180', which may be referred to herein as a pre-trench heterojunction shield process.

Figure 7B:
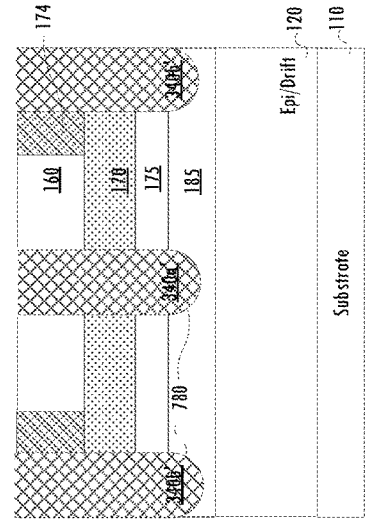
FIGS. 7A, 7B, 7C, 7D, 7E, 7F, 7G, and 7H are schematic cross-sectional views illustrating example fabrication operations for forming power semiconductor devices including bottom shielding structures below the gate trenches and support shielding structures spaced apart from sidewalls of the gate trenches according to still further embodiments of the present invention.
Figure 7A:
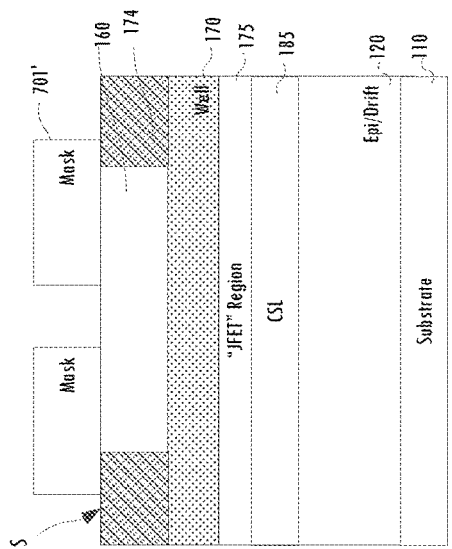

As shown in FIG. 7A, a semiconductor layer structure 106 is provided as described with reference to any of the embodiments above. A mask layer 701 is formed on the surface S of the semiconductor layer structure 106, and a patterning layer 702 is formed on the mask layer 701. In FIG. 7B, the mask layer 701 is patterned using the patterning layer 702 (e.g., photolithographically) to form a first etch mask pattern 701' including openings therein exposing portions of the surface S of the semiconductor layer structure 106.

Figure 7D:
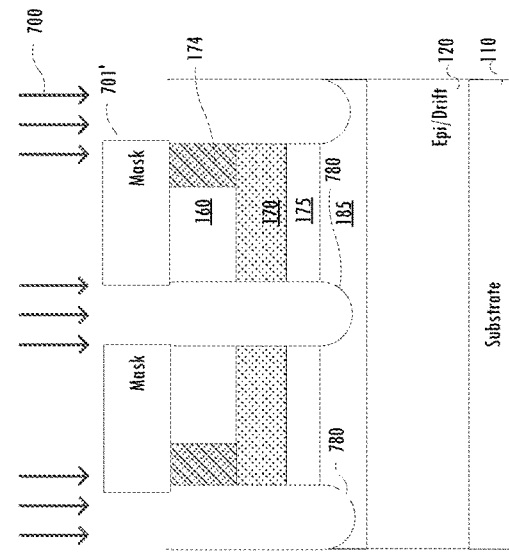
Figure 7C:
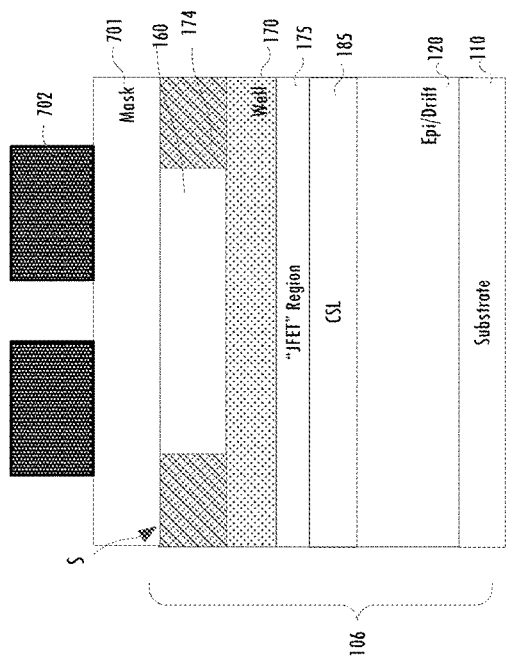

In FIG. 7C, one or more etching processes 700 are performed using the first mask pattern 701' as an etching mask to form shield trenches 780 into the exposed portions of the surface S. The etching process(es) 700 may be controlled to provide the shield trenches 780 with the desired depths (e.g., D1, D2). In FIG. 7D, one or more deposition processes are performed to form a material of the second conductivity type (e.g., p-type) in the shield trenches 780, and the material of the second conductivity type may be removed from the surface S of the semiconductor layer structure 106 (e.g., by one or more planarization processes), thereby forming shielding structures 340a' and 340b' extending into the drift region 120 toward the substrate 100. For example, the drift region 120 may be formed of an n-type material (e.g., SiC), and the shielding structures 340a' and 340b' may be formed of one or more p-type materials (e.g., p-NiO, p-poly-Si, p-GaN, p-Ga$_2$O$_3$).

The examples of FIGS. 7A to 7D illustrate a single mask 701', etching process 700, and deposition process to form the bottom shielding structures 340a' and the support shielding structures 340b' at the same time or in the same process step, such that the shielding structures 340a', 340b' may be formed of the same material(s) and/or may have the same depths (i.e., D1=D2) relative to the surface S of the semiconductor layer structure 106. However, it will be understood that embodiments described herein are not limited to a single masking and/or etching process, and that multiple masking and etching operations may be sequentially performed with different mask shapes to expose different portions of the surface S, with different etching processes to form the shield trenches 780 of different depths, and/or with different deposition processes (e.g., one or more of FIG. 7A, 7B, 7C, or 7D may be repeated or iterated), such that the bottom shielding structures 340a' and the support shielding structures 340b' may have different shapes, different depths (i.e., D1≠D2), and/or may be formed of different materials from one another (e.g., the bottom shielding structures 340a' may be p-poly-Si and the support shielding structures 340b' may be p-NiO).

Figure 7E:
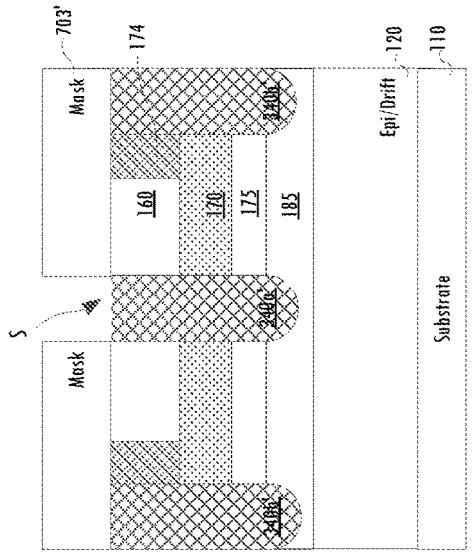
Figure 7F:
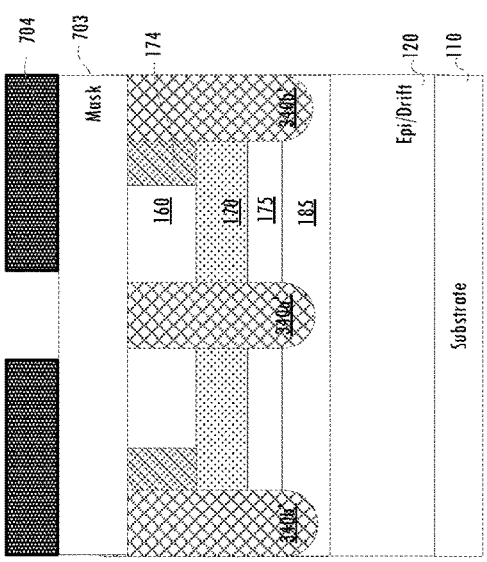
Figure 7G:
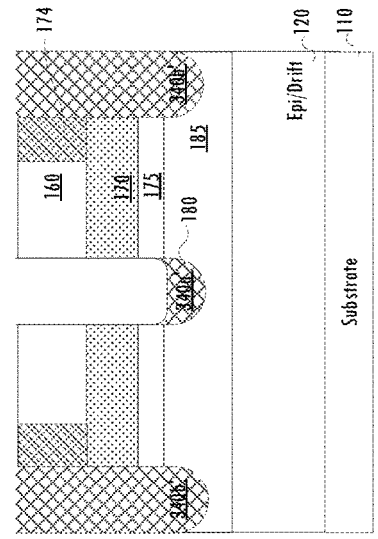
Figure 7H:
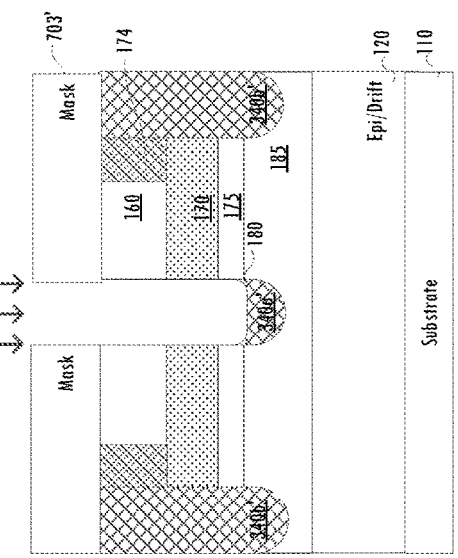

In FIG. 7E, a mask layer 703 (e.g., an oxide layer) is formed on the surface S of the semiconductor layer structure 106, and a patterning layer 704 is formed on the mask layer 703. In FIG. 7F, the mask layer 703 is patterned using the patterning layer 704 to form a second etch mask pattern 703' including openings therein exposing portions of the surface S of the semiconductor layer structure 106 (including surfaces of the bottom shielding structures 340a') between the support shielding structures 340b'. In FIG. 7G, an etching process 750 is performed to selectively etch the portions of the surface S exposed by the etching mask pattern 503', thereby forming gate trenches 180 extending into the drift region 120 between and spaced apart from the support shielding structures 340b'. The bottom shielding structures 340a' remain under and at least partially along the bottom surface of the gate trenches 180. In FIG. 7H, the mask pattern 503' is removed. A gate oxide layer 182, gate electrode 184, source contacts 190, intermetal dielectric 186, and metal layer 196 may be subsequently formed to provide the device 300b of FIG. 3B.

FIGS. 8A-8H are schematic cross-sectional views illustrating example fabrication operations for forming power semiconductor devices including bottom shielding structures below the gate trenches and support shielding structures spaced apart from sidewalls of the gate trenches according to yet further embodiments of the present invention. In particular, FIGS. 8A-8H illustrate methods of forming the shielding structures 340a', 340b' of different material(s) than the drift region 120, with the bottom shielding structure 340a' being formed after the gate trench 180', which may be referred to herein as a post-trench heterojunction shield process.

As shown in FIG. 8A, a semiconductor layer structure 106 is provided as described in any of the embodiments above. A mask layer 801 is formed on the surface S of the semiconductor layer structure 106, and a patterning layer 802 is formed on the mask layer 801. In FIG. 8B, the mask layer 801 is patterned (e.g., photolithographically) using the patterning layer 802 to form a first etch mask pattern 801' including openings therein exposing portions of the surface S of the semiconductor layer structure 106.

In FIG. 8C, one or more etching processes 800 are performed using the first mask pattern 801' as an etching mask to form support shield trenches 880 extending into the exposed portions of the surface S. The etching process(es) 800 may be controlled to form the support shielding trenches 880 with a desired depth (e.g., D2) relative to the surface S. In FIG. 8D, one or more deposition processes are performed to form a material of the second conductivity type (e.g., p-type) in the support shield trenches 880, and the material of the second conductivity type is removed from the surface S (e.g., by one or more planarization processes), thereby forming support shielding structures 340b' extending into the drift region 120 toward the substrate 100. For example, the drift region 120 may be formed of an n-type material (e.g., SiC), and the support shielding structures 340b' may be formed of p-type materials (e.g., p-NiO, p-poly-Si, p-GaN, p-Ga$_2$O$_3$).

Figure 8E:
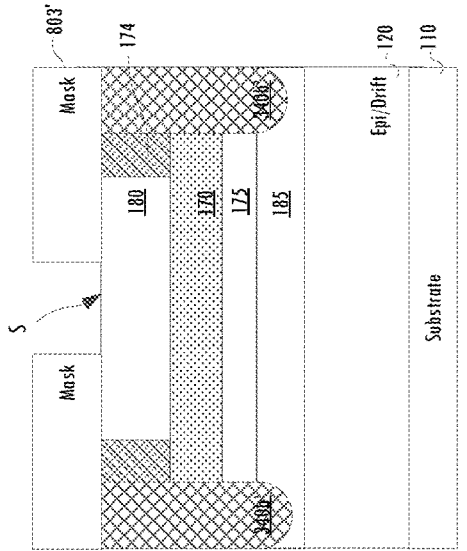
Figure 8F:
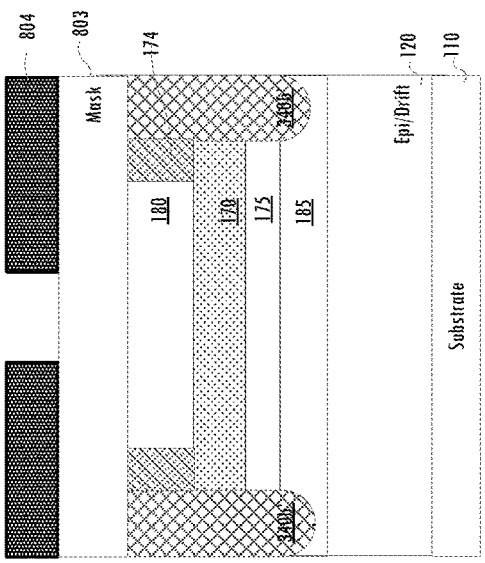

In FIG. 8E, an etching mask layer 803 (e.g., an oxide layer) is formed on the surface S of the semiconductor layer structure 106, and a patterning layer 804 is formed on the etching mask layer 803. In FIG. 8F, the etching mask layer 803 is patterned using the patterning layer 804 to form second etch mask pattern 803' including openings therein exposing portions of the surface S of the semiconductor layer structure 106 between the support shielding structures 340b'.

Figure 8G:
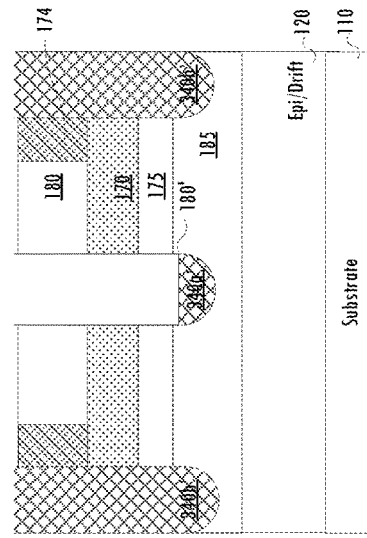

In FIG. 8G, an etching process 850 is performed to selectively etch the portions of the surface S exposed by the etching mask pattern 803', thereby forming gate trenches 180' extending into the drift region 120 between and spaced apart from the support shielding structures 340b'. The etching process(es) 850 may be controlled to form the support gate trenches 180' with a desired depth (e.g., D1) relative to the surface S, which may be the same as or different than the depth D2 of the support shield trenches 880.

Figure 8H:
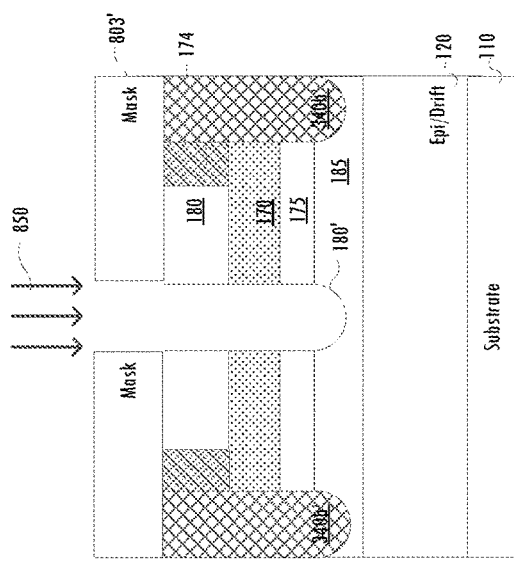

In FIG. 8H, one or more selective deposition processes are performed to form a material of the second conductivity type (e.g., p-type) in the gate trenches 180', thereby forming bottom shielding structures 340a' extending into the drift region 120 toward the substrate 100. The bottom shielding structures 340a' may partially fill the gate trenches 180', such that the depth of the gate trenches 180' may define the depth D1 of the bottom shielding structures 340a'. The different deposition processes may be performed such that the bottom shielding structures 340a' and the support shielding structures 340b' may have different shapes, different depths (i.e., D1≠D2), and/or may be formed of different materials from one another. The second mask pattern 803' is removed, and a gate oxide layer 182, gate electrode 184, source contacts 190, intermetal dielectric 186, and metal layer 196 may be subsequently formed provide the device 300b of FIG. 3B.

In the example operations of FIGS. 8A-8H, a first etching and deposition process is used to form the support shield structures 340b' prior to forming the gate trenches 180', and the bottom shield structures 340a' are formed using a second etching and deposition process to fill a portion of the gate trenches 180'. The operations shown in FIGS. 8A to 8H may thus be advantageous with respect to ease of forming the support shielding structures 340b' with different depths and/or materials than the bottom shielding structures 340a'. For example, the use of multiple etching processes 800, 850 and/or multiple deposition processes may allow for selection of different depths and/or materials such that the support shield structures 340b' extend to a greater depth and/or are formed of a lower resistance material than the bottom shield structures 340a'.

It will be understood that any of the operations shown in FIGS. 5A-8H may be combined in various embodiments herein. For example, one or more of the pre-trench shield implant operations of FIGS. 5A-5F may be performed between one or more of the pre-trench heterojunction shield operations of FIGS. 7A-7H, or vice versa. Likewise, one or more of the post-trench shield implant operations of FIGS. 6A-6H may be performed between one or more of the post-trench heterojunction shield operations of FIGS. 8A-8H, or vice versa. More generally, the fabrication operations shown in FIGS. 5A-8H are illustrated by way of example with reference to forming the implanted shielding regions 340a, 340b of FIG. 3A or the heterojunction shielding regions 340a', 340b of FIG. 3B, but it will be understood that any of the operations shown may be utilized in combination to provide any desired combination of implanted and heterojunction shielding regions, such as for example, any of the structures shown in FIGS. 3C to 4D, with similar or different shapes, similar (i.e., D1=D2) or different (i.e., D1≠D2) depths, and/or the same or different materials from one another.

The embodiments described herein thus illustrate various examples of different combinations of bottom shielding structures (e.g., 240a, 340a, 340a') and support shielding structures (e.g., 240b, 340b, 340b') in accordance with the present invention, which may be beneficial for protecting the gate oxide 182, particularly at the bottom surface and edges/corners of the gate trench 180, 180'. However, it will be understood that embodiments of the present invention may include any and all combinations of the features described herein, and are not limited to the examples illustrated. Embodiments of the present invention may be used in trenched vertical semiconductor power transistors, including but not limited to MOSFETs, IGBTs, or other power devices including a transistor terminal in a trench region.

In the description above, each example embodiment is described with reference to regions of particular conductivity types. It will be appreciated that opposite conductivity type devices may be formed by simply reversing the conductivity of the n-type and p-type layers in each of the above embodiments. Thus, it will be appreciated that the present invention covers both n-channel and p-channel devices for each different device structure (e.g., MOSFET, IGBT, etc.).

The present invention has primarily been discussed above with respect to silicon carbide based power semiconductor devices. It will be appreciated, however, that silicon carbide is used herein as an example and that the devices discussed herein may be formed in any appropriate wide bandgap semiconductor material system. As an example, gallium nitride based semiconductor materials (e.g., gallium nitride, aluminum gallium nitride, etc.) may be used instead of silicon carbide in any of the embodiments described above. More generally, while discussed with reference to silicon carbide devices, embodiments of the present invention are not so limited, and may have applicability to devices formed using other wide bandgap semiconductor materials, for example, gallium nitride, zinc selenide, or any other II-VI or III-V wide bandgap compound semiconductor materials.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Embodiments of the invention are also described with reference to a fabrication operations. It will be appreciated that the steps shown in the fabrication operations need not be performed in the order shown.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A power semiconductor device, comprising:
a semiconductor layer structure comprising a drift region of a first conductivity type;
a gate trench extending into the semiconductor layer structure, the gate trench comprising sidewalls and a bottom surface therebetween;
a bottom shielding structure of a second conductivity type under the bottom surface of the gate trench; and
first and second support shielding structures of the second conductivity type extending into the semiconductor layer structure on opposing sides of the gate trench,
wherein the gate trench is one of a plurality of gate trenches extending into the semiconductor layer structure, and the first and second support shielding structures extend at least partially alongside and are laterally spaced apart from respective sidewalls of the plurality of gate trenches.

2. The power semiconductor device of claim 1, wherein one or more of the first and second support shielding structures extends into the semiconductor layer structure to a different depth than that of the bottom shielding structure relative to a surface of the semiconductor layer structure.

3. The power semiconductor device of claim 1, wherein at least one of the bottom shielding structure, the first support shielding structure, or the second support shielding structure comprises a material that is different from that of the drift region.

4. The power semiconductor device of claim 3, wherein the drift region comprises a wide bandgap semiconductor material, and the at least one of the bottom shielding structure, the first support shielding structure, or the second support shielding structure comprises polysilicon, nickel oxide, gallium nitride, or gallium oxide.

5. The power semiconductor device of claim 3, wherein the at least one of the bottom shielding structure, the first support shielding structure, or the second support shielding structure further comprises an implanted portion of the semiconductor layer structure.

6. The power semiconductor device of claim 1, wherein the bottom shielding structure comprises a first concentration of dopants of the second conductivity type, and the first and second support shielding structures comprise a second concentration of dopants of the second conductivity type that is different from the first concentration.

7. The power semiconductor device of claim 1, wherein the semiconductor layer structure further comprises a substrate including the drift region thereon and a well region of the second conductivity type in or on the drift region opposite the substrate,
wherein the first and second support shielding structures extend through the well region and beyond the bottom shielding structure, and are spaced apart from the substrate.

8. The power semiconductor device of claim 7, wherein the first and second support shielding structures have a different concentration of dopants of the second conductivity type than the well region.

9. The power semiconductor device of claim 7, wherein the first and second support shielding structures are spaced apart from the substrate by about 1 to about 100 microns.

10. The power semiconductor device of claim 1, wherein the bottom shielding structure extends along a portion of the bottom surface of the gate trench.

11. The power semiconductor device of claim 1, wherein the bottom shielding structure extends along an entirety of the bottom surface of the gate trench.

12. A power semiconductor device, comprising:
a semiconductor layer structure comprising a drift region of a first conductivity type;
a gate trench extending into the semiconductor layer structure, the gate trench comprising sidewalls and a bottom surface therebetween;
a bottom shielding structure of a second conductivity type under the bottom surface of the gate trench; and
first and second support shielding structures of the second conductivity type extending into the semiconductor layer structure on opposing sides of the gate trench and spaced apart from the sidewalls thereof,
wherein the first and second support shielding structures extend into the semiconductor layer structure beyond the bottom shielding structure by about 0.1 to about 1 micron relative to a surface of the semiconductor layer structure.

13. A power semiconductor device, comprising:
a semiconductor layer structure comprising a drift region of a first conductivity type;
a gate trench extending into the semiconductor layer structure, the gate trench comprising sidewalls and a bottom surface therebetween;
a bottom shielding structure of a second conductivity type under the bottom surface of the gate trench; and
first and second support shielding structures of the second conductivity type extending into the semiconductor layer structure on opposing sides of the gate trench and spaced apart from the sidewalls thereof,
wherein the bottom shielding structure comprises a first concentration of dopants of the second conductivity type, the first and second support shielding structures comprise a second concentration of dopants of the second conductivity type, and the second concentration is higher than the first concentration.

14. A power semiconductor device, comprising:
a semiconductor layer structure comprising a drift region of a first conductivity type;
a gate trench extending into the semiconductor layer structure, the gate trench comprising sidewalls and a bottom surface therebetween;
a bottom shielding structure of a second conductivity type under the bottom surface of the gate trench; and
first and second support shielding structures of the second conductivity type extending into the semiconductor layer structure on opposing sides of and spaced apart from the sidewalls of the gate trench,
wherein a distance of extension into the semiconductor layer structure relative to a surface of the semiconductor layer structure and/or dopant concentration of the bottom shielding structure is less than that of each of the first and second support shielding structures.

15. The power semiconductor device of claim 14, wherein the distance of extension into the semiconductor layer structure of one or more of the first and second support shielding structures is greater than that of the bottom shielding structure relative to the surface of the semiconductor layer structure.

16. The power semiconductor device of claim 15, wherein the first and second support shielding structures extend into the semiconductor layer structure beyond the bottom shielding structure by about 0.1 to about 1 micron.

17. The power semiconductor device of claim 14, wherein a material composition of at least one of the bottom shielding structure, the first support shielding structure, or the second support shielding structure is different from that of the drift region.

18. The power semiconductor device of claim 17, wherein the drift region comprises a wide bandgap semiconductor material, and the at least one of the bottom shielding structure, the first support shielding structure, or the second support shielding structure comprises polysilicon, nickel oxide, gallium nitride, or gallium oxide.

19. The power semiconductor device of claim 18, wherein the at least one of the bottom shielding structure, the first support shielding structure, or the second support shielding structure further comprises an implanted region of the drift region.

20. The power semiconductor device of claim 14, wherein the distance of extension into the semiconductor layer structure relative to the surface of the semiconductor layer structure is less than that of each of the first and second support shielding structures, and wherein the dopant concentration of the first and second support shielding structures is lower than that of the bottom shielding structure.

21. The power semiconductor device of claim 14, wherein the dopant concentration of the first and second support shielding structures is higher than that of the bottom shielding structure.

22. The power semiconductor device of claim 14, wherein the semiconductor layer structure further comprises a substrate including the drift region thereon, and wherein the first and second support shielding structures are spaced apart from the substrate by about 1 to about 100 microns.

23. A method of fabricating a power semiconductor device, the method comprising:
providing a semiconductor layer structure comprising a drift region of a first conductivity type;
forming a bottom shielding structure and first and second support shielding structures of a second conductivity type extending into the semiconductor layer structure; and
after forming the bottom shielding structure, forming a gate trench extending into the semiconductor layer structure and spaced apart from the first and second support shielding structures,
wherein the bottom shielding structure is under the gate trench.

24. The method of claim 23, wherein forming the bottom shielding structure and the first and second support shielding structures comprises:
forming each of the first and second support shielding structures extending into the semiconductor layer structure to a greater depth than that of the bottom shielding structure relative to a surface of the semiconductor layer structure.

25. The method of claim 24, wherein the first and second support shielding structures extend into the semiconductor layer structure beyond the bottom shielding structure by about 0.1 to about 1 micron.

26. The method of claim 23, wherein forming at least one of the bottom shielding structure or the first and second support shielding structures comprises:
performing one or more etching operations to form respective shielding trenches in the semiconductor layer structure; and
performing one or more deposition operations to form a material that is different from that of the drift region in the respective shielding trenches.

27. The method of claim 26, wherein forming the at least one of the bottom shielding structure or the first and second support shielding structures further comprises:
performing one or more ion implantation operations to implant dopants of the second conductivity type into portions of the semiconductor layer structure under the respective shielding trenches.

28. The method of claim 23, wherein forming at least one of the bottom shielding structure or the first and second support shielding structures comprises:
performing one or more ion implantation operations to implant dopants of the second conductivity type into the semiconductor layer structure,
wherein, responsive to the one or more ion implantation operations, the bottom shielding structure comprises a first concentration of the dopants of the second conductivity type, and the first and second support shielding structures comprise a second concentration of dopants of the second conductivity type that is higher than the first concentration.

29. A method of fabricating a power semiconductor device, the method comprising:
providing a semiconductor layer structure comprising a drift region of a first conductivity type;
forming first and second support shielding structures of a second conductivity type extending into the semiconductor layer structure;
after forming the first and second support shielding structures, forming a gate trench extending into the semiconductor layer structure and spaced apart from the first and second support shielding structures, the gate trench comprising sidewalls and a bottom surface therebetween; and
forming a bottom shielding structure of the second conductivity type under the bottom surface of the gate trench.

30. The method of claim 29, wherein forming the first and second support shielding structures comprises:
before forming the gate trench, forming one or more of the first and second support shielding structures extending into the semiconductor layer structure to a second depth that is greater than a first depth of the bottom shielding structure, relative to the surface of the semiconductor layer structure.

31. The method of claim 30, wherein the second depth is greater than the first depth by about 0.1 to about 1 micron.

32. The method of claim 29, wherein forming the first and second support shielding structures comprises:
before forming the gate trench, performing one or more etching operations to form respective shielding trenches in the semiconductor layer structure, and performing one or more deposition operations to form a material that is different from that of the drift region in the respective shielding trenches.

33. The method of claim 32, wherein forming the first and second support shielding structures further comprises:
before forming the gate trench, performing one or more ion implantation operations to implant dopants of the second conductivity type into portions of the semiconductor layer structure under the respective shielding trenches.

34. The method of claim 29, wherein forming the first and second support shielding structures comprises:
before forming the gate trench, performing one or more ion implantation operations to implant dopants of the second conductivity type into the semiconductor layer structure,
wherein the first and second support shielding structures comprise a second concentration of dopants of the second conductivity type that is greater than a first concentration of the dopants of the second conductivity type of the bottom shielding structures.

* * * * *